(12) United States Patent
Mohanty

(10) Patent No.: US 11,307,357 B2
(45) Date of Patent: Apr. 19, 2022

(54) OVERCOATING SLANTED SURFACE-RELIEF STRUCTURES USING ATOMIC LAYER DEPOSITION

(71) Applicant: Facebook Technologies, LLC, Menlo Park, CA (US)

(72) Inventor: Nihar Ranjan Mohanty, Snoqualmie, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 110 days.

(21) Appl. No.: 16/660,463

(22) Filed: Oct. 22, 2019

(65) Prior Publication Data

US 2020/0209483 A1  Jul. 2, 2020

Related U.S. Application Data

(60) Provisional application No. 62/786,148, filed on Dec. 28, 2018.

(51) Int. Cl.
*C23C 16/22* (2006.01)
*G02B 6/34* (2006.01)
(Continued)

(52) U.S. Cl.
CPC .............. *G02B 6/34* (2013.01); *C23C 16/22* (2013.01); *C23C 16/45525* (2013.01);
(Continued)

(58) Field of Classification Search
CPC .... C23C 16/22; C23C 16/45525; C23C 16/56
See application file for complete search history.

(56) References Cited

U.S. PATENT DOCUMENTS 6,288,357 B1   9/2001 Dyer
10,328,737 B2 * 6/2019 Lok ..................... C09D 11/033
(Continued)

FOREIGN PATENT DOCUMENTS

TW    202043020       12/2020
TW    202109133 A     3/2021
(Continued)

OTHER PUBLICATIONS

Alasaarela, T., et al., "Reduced propagation loss in silicon strip and slot waveguides coated by atomic layer deposition". Optics Express 11529, Jun. 6, 2011 / vol. 19, No. 12 / 11529-11538.*
(Continued)

*Primary Examiner* — Bret P Chen
(74) *Attorney, Agent, or Firm* — Weaver Austin Villeneuve & Sampson LLP

(57) ABSTRACT

Techniques for overcoating slanted structures and devices obtained using the techniques are disclosed. In some embodiments, a method of forming an overcoat layer on a surface-relief structure on a substrate includes receiving the substrate with the surface-relief structure. The surface-relief structure includes a plurality of ridges slanted with respect to the substrate, and a plurality of grooves each between two adjacent ridges. The method further includes depositing, in each cycle of a plurality of cycles, a uniform layer of an overcoat material on surfaces of the plurality of ridges and bottoms of the plurality of grooves. The deposited layers of the overcoat material and the plurality of ridges collectively form a light-coupling structure on the substrate. A surface of the overcoat layer is planar.

16 Claims, 14 Drawing Sheets

(51) Int. Cl.
  G02B 27/01       (2006.01)
  C23C 16/56       (2006.01)
  C23C 16/455      (2006.01)
(52) U.S. Cl.
  CPC .......... *C23C 16/56* (2013.01); *G02B 27/0172* (2013.01); *G02B 2027/0112* (2013.01); *G02B 2027/0178* (2013.01)

(56) References Cited

U.S. PATENT DOCUMENTS

| | | | | |
|---|---|---|---|---|
| 10,502,958 | B2* | 12/2019 | Mohanty | G02B 6/122 |
| 2006/0275625 | A1* | 12/2006 | Lieberman | B41F 5/24 |
| | | | | 428/697 |
| 2012/0326178 | A1* | 12/2012 | Fehrer | H01L 31/02005 |
| | | | | 257/88 |
| 2013/0230068 | A1* | 9/2013 | Lell | H01S 5/2202 |
| | | | | 372/44.01 |
| 2014/0056551 | A1* | 2/2014 | Liu | G02F 1/025 |
| | | | | 385/2 |
| 2014/0153136 | A1 | 6/2014 | Flint et al. | |
| 2015/0063753 | A1* | 3/2015 | Evans | G02B 6/132 |
| | | | | 385/37 |
| 2015/0131938 | A1* | 5/2015 | Tseng | G02B 6/122 |
| | | | | 385/14 |
| 2016/0033697 | A1 | 2/2016 | Sainiemi et al. | |
| 2016/0033784 | A1 | 2/2016 | Levola et al. | |
| 2017/0077576 | A1* | 3/2017 | Kirino | H01Q 3/32 |
| 2017/0082544 | A1* | 3/2017 | Van Dorpe | G01N 21/648 |
| 2017/0256330 | A1 | 9/2017 | Moldovan | |
| 2017/0299865 | A1 | 10/2017 | Vallius et al. | |
| 2017/0307886 | A1 | 10/2017 | Stenberg et al. | |
| 2017/0307887 | A1 | 10/2017 | Stenberg et al. | |
| 2018/0081170 | A1 | 3/2018 | Kimmel et al. | |
| 2020/0213579 | A1* | 7/2020 | Mohanty | H04N 13/344 |

FOREIGN PATENT DOCUMENTS

| | | |
|---|---|---|
| WO | WO 2005/115119 A2 * | 12/2005 |
| WO | 2020139741 | 7/2020 |
| WO | 2020139910 | 7/2020 |

OTHER PUBLICATIONS

Solehmainen, Kimmo, et al., "Erbium-Doped Waveguides Fabricated With Atomic Layer Deposition Method". IEEE Photonics Technology Letters, vol. 16, No. 1, Jan. 2004, pp. 194-196.*

Caspar, A, et al., "High-aspect-ratio electro-optical ridge waveguide made by precise dicing and atomic layer deposition." 2017 Conference on Lasers and Electro-Optics Europe & European Quantum Electronics Conference (CLEO/Europe-EQEC), 2017, pp. 1-1, doi: 10.1109/CLEOE-EQEC.2017.8086602. Abstract Only.*

Lizarraga-Medina, Eder, et al., "Optical waveguides fabricated in atomic layer deposited Al2O3by ultrafast laser ablation." Results in Optics 2 (2021) 100060, pp. 1-5.*

Miller, J. Michael, et al., "Design and fabrication of binary slanted surface-relief gratings for a planar optical interconnection". Applied Optics, Optical Society of America, 1997, 36 (23), pp. 5717-5727.*

Hobbs, Douglas S., et al., "Update on the Development of High Performance Anti-Reflecting Surface Relief Micro-Structures". SPIE 6545-34, Apr. 12, 2007; pp. 1-14.*

Romanov, D.A., et al., "Surface Relief and Structure of Electroexplosive Composite Surface Layers of the Molybdenum-Copper System". Journal of Surface Investigation. Xray, Synchrotron and Neutron Techniques, 2011, vol. 5, No. 6, pp. 1112-1117.*

Menard, Etienne, et al., "Improved Surface Chemistries, Thin Film Deposition Techniques, and Stamp Designs for Nanotransfer Print". Langmuir, 2004, 20, 6871-6878.*

Southwell, William H., et al., "Pyramid-array surface-relief structures producing antireflection index matching on optical surfaces". J. Opt. Soc. Am. A, vol. 8, No. 3, Mar. 1991, pp. 549-553.*

Gololobov, G.P., et al., "Peculiarities of deposition of thick coatings based on binary Co—W alloy". 14th International Conference on Films and Coatings. IOP Conf. Series: Journal of Physics: Conf. Series 1281 (2019) 012022, pp. 1-5.*

Kim, D.Y., et al., "Laser-induced holographic surface relief gratings on nonlinear optical polymer films". Appl. Phys. Lett. vol. 66 Issue 10, 1166 (1995) 1 page. Abstract Only.*

International Application No. PCT/US2019/067739, International Search Report and Written Opinion dated Jun. 29, 2020, 15 pages.

Yoo et al., "High-Contrast Infrared Absorption Spectroscopy via Mass-Produced Coaxial Zero-Mode Resonators with Sub-10 nm Gaps", Nano Letters, vol. 18, No. 3, Feb. 13, 2018, pp. 1930-1936, XP055679509, US ISSN: 1530-6984, DOI: 10.1021/acs.nanolett. 7b05295.

International Application No. PCT/US2019/068522, International Search Report and Written Opinion dated Apr. 7, 2020, 14 pages.

U.S. Non-Final Office Action dated Sep. 16, 2021 in U.S. Appl. No. 16/660,597.

European Search Report for European Application No. 21203040.7, dated Feb. 8, 2022, 6 pages.

European Search Report for European Application No. 21203041.5, dated Feb. 8, 2022, 7 pages.

* cited by examiner

OVERCOATING SLANTED SURFACE-RELIEF STRUCTURES USING ATOMIC LAYER DEPOSITION

RELATED APPLICATIONS

This application claims the benefit of U.S. Provisional Application No. 62/786,148, filed Dec. 28, 2018, entitled "OVERCOATING SLANTED SURFACE-RELIEF STRUCTURES USING ATOMIC LAYER DEPOSITION", which is assigned to the assignee hereof, and incorporated by reference herein in its entirety.

BACKGROUND

An artificial reality system, such as a head-mounted display (HMD) or heads-up display (HUD) system, generally includes a display configured to present artificial images that depict objects in a virtual environment. The display may display virtual objects or combine images of real objects with virtual objects, as in virtual reality (VR), augmented reality (AR), or mixed reality (MR) applications. For example, in an AR system, a user may view both images of virtual objects (e.g., computer-generated images (CGIs)) and the surrounding environment by, for example, seeing through transparent display glasses or lenses (often referred to as optical see-through) or viewing displayed images of the surrounding environment captured by a camera (often referred to as video see-through).

One example optical see-through AR system may use a waveguide-based optical display, where light of projected images may be coupled into a waveguide (e.g., a substrate), propagate within the waveguide, and be coupled out of the waveguide at different locations. In some implementations, the light of the projected images may be coupled into or out of the waveguide using a diffractive optical element, such as a slanted surface-relief grating. In many cases, it may be challenging to cost-effectively fabricate the slanted surface-relief grating.

SUMMARY

This disclosure relates generally to techniques for producing an overcoat layer on slanted surface-relief structures. Slanted surface-relief structures, such as slanted surface-relief gratings, may include ridges and grooves. An overcoat layer may be formed over the slanted surface-relief gratings filling the grooves and covering the ridges. The slanted surface-relief gratings may include varying configurations, such as varying slant angle of the ridges, varying duty cycle of the gratings, varying depth of the grooves defined by the ridges, and the like. To achieve a uniform overcoat, the overcoat material may be formed or deposited over the slanted surface-relief gratings in a cyclic manner. In some embodiments, only one atomic layer of the overcoat material may be deposited in each cycle. In some embodiments, two or more atomic layers of the overcoat material may be deposited in each cycle. Following the deposition operation in each cycle, a removal operation may be performed to remove select portions of the overcoat material deposited in the preceding deposition operation. By forming or depositing the overcoat material in a cyclic manner, a substantial planar top surface of the overcoat layer may be achieved.

In some embodiments, a method of forming an overcoat layer on a surface-relief structure on a substrate may include receiving the substrate with the surface-relief structure. The surface-relief structure may include a plurality of ridges slanted with respect to the substrate. The surface-relief structure may further include a plurality of grooves each between two adjacent ridges. The method may further include depositing, in each cycle of a plurality of cycles, a uniform layer of an overcoat material on surfaces of the plurality of ridges and bottoms of the plurality of grooves. The deposited layers of the overcoat material and the plurality of ridges may collectively form a light-coupling structure on the substrate.

In some embodiments, the uniform layer of the overcoat material deposited in each cycle may include one atomic layer of the overcoat material. In some embodiments, a top surface of the overcoat layer may be planar.

In some embodiments, a top surface of the overcoat layer may include a plurality of planar surface portions and a plurality of concave surface portions forming a plurality of dips having a depth lower than a depth of the plurality of grooves. In some embodiments, the plurality of dips may be aligned with the plurality of grooves. In some embodiments, a ratio of a depth of the overcoat layer from top surfaces of the plurality of ridges to a top surface of the overcoat layer to a depth of the plurality of dips may range between 40:1 and 2:1. In some embodiments, a ratio of a depth of the overcoat layer from top surfaces of the plurality of ridges to a top surface of the overcoat layer to a depth of the plurality of grooves may range between 1:2 and 1:100.

In some embodiments, the surface-relief structure may include a varying period across the substrate or a varying duty cycle across the substrate. In some embodiments, the plurality of ridges may each have a slant angle that may be at least 45°. In some embodiments, the plurality of grooves may each have a depth that may be at least 100 nm.

In some embodiments, the method may further include, in each cycle, after depositing the uniform layer of the overcoat material, removing portions of the uniform layer of the overcoat material deposited on top surfaces of the plurality of ridges at a first removal rate, and/or removing portions of the uniform layer of the overcoat material deposited on the bottoms of the plurality of grooves at a second removal rate. In some embodiments, the first removal rate may be greater than the second removal rate. In some embodiments, the uniform layer of the overcoat material deposited in each cycle may include two or more atomic layers of the overcoat material. In some embodiments, the portions of the uniform layer of the overcoat material removed from the top surfaces of the plurality of ridges may include all of the overcoat material deposited on the top surfaces of the plurality of ridges.

In some embodiments, a refractive index of the overcoat material may be different from a refractive index of the plurality of ridges. In some embodiments, the overcoat material may include at least one of hafnium oxide, titanium oxide, tantalum oxide, tungsten oxide, zirconium oxide, gallium sulfide, gallium nitride, gallium phosphide, silicon, silicon nitride, silicon oxide, alumina, porous silica, a high refractive index polymer, or a fluorinated low index monomer or polymer. In some embodiments, the plurality of ridges may include at least one of amorphous silicon, silicon oxide, silicon nitride, silicon carbide, silicon oxynitride (SiOxNy), spin on carbon (SOC), amorphous carbon, diamond like carbon (DLC), titanium oxide, aluminum oxide, tantalum oxide, or hafnium oxide. In some embodiments, the substrate may include a waveguide.

In some embodiments, a device may be obtained by a process. The device may include a substrate and a surface-relief structure on the substrate. The surface-relief structure may include a plurality of ridges slanted with respect to the substrate and a plurality of grooves each between two adjacent ridges. The device may further include an overcoat layer on the surface-relief structure. The overcoat layer and the plurality of ridges may collectively form a light-coupling structure on the substrate. The overcoat layer may be formed by depositing an overcoat material on surfaces of the plurality of ridges and bottoms of the plurality of grooves in a plurality of cycles. In each cycle of the plurality of cycles, a uniform layer of the overcoat material may be deposited on the surfaces of the plurality of ridges and the bottoms of the plurality of grooves. In some embodiments, the uniform layer of the overcoat material deposited in each cycle of the plurality of cycles may include one atomic layer of the overcoat material.

This summary is neither intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim. The foregoing, together with other features and examples, will be described in more detail below in the following specification, claims, and accompanying drawings.

BRIEF DESCRIPTION OF THE DRAWINGS

Illustrative embodiments are described in detail below with reference to the following figures.

Figure 1:
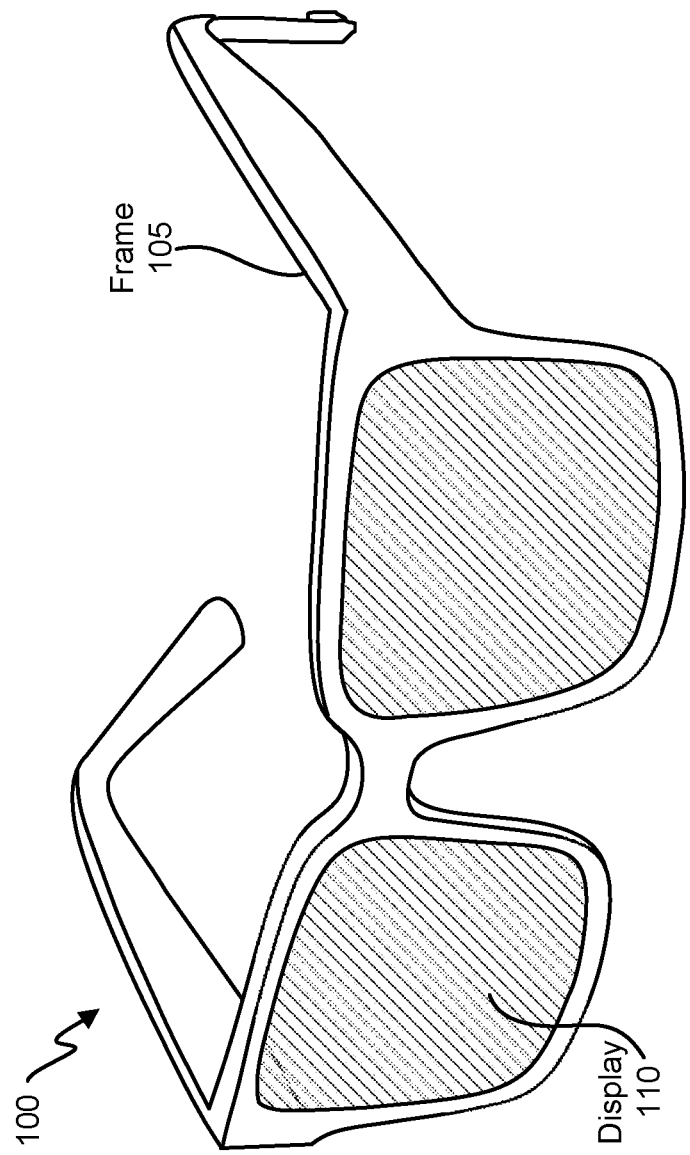
FIG. 1 is a simplified diagram of an example near-eye display according to certain embodiments.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

This disclosure relates to waveguide-based near-eye display systems. More specifically, and without limitation, this disclosure relates to techniques for producing an overcoat layer on slanted surface-relief structures.

Slanted surface-relief structures, such as slanted surface-relief gratings, may be used in many optical or electronic devices to manipulate behavior of light and/or electricity. According to certain embodiments, slanted surface-relief gratings may be used in some optical devices, such as near-eye display systems in artificial reality applications, to create high refractive index variations, high diffraction efficiencies, and/or high light transfer efficiencies. The slanted surface-relief gratings may include ridges and grooves. To protect the structure of the slanted surface-relief gratings and to increase field of view and reduce rainbow artifacts, etc., an overcoat layer may be formed over the slanted surface-relief gratings. The overcoat material may have a refractive index different from that of the material forming the ridges. The ridges and the overcoat material filling the grooves and covering the ridges may function together as a grating coupler for the waveguide display.

Spin-coating techniques may offer a relatively low-cost and simple option, but the overcoat material may not be evenly coated cross the slanted surface-relief gratings partly due to the varying configuration of the gratings, such as the varying slant angle of the ridges, the varying duty cycle of the gratings, the varying depth of the grooves defined by the ridges, and the like. When the slant angle of the ridges may become relatively large, it may become more difficult to achieve a uniform overcoat. The thickness variation can cause significant loss of yield due to stray light paths. Further, in some applications, the grooves may be quite narrow and/or deep at least in some regions, and when spin-coating techniques are utilized, solvent or air trapping may occur in, for example, the grooves. The trapped solvent or air can lead to varying refractive index within the overcoat layer and efficiency loss of the device.

The present technology overcomes these issues by depositing the overcoat material in a cyclic manner. In some embodiments, only one atomic layer of the overcoat material may be deposited in each cycle. The surface profile of the overcoat layer obtained by repeating the atomic layer deposition (ALD) process can be significantly improved as compared to that obtained using conventional spin-coating techniques.

In some embodiments, two or more atomic layers of the overcoat material may be deposited in each cycle. Following the deposition operation in each cycle, a removal operation may be performed to remove select portions of the overcoat material deposited in the preceding deposition operation. By repeating the deposition and removal operations in multiple cycles, a substantial planar top surface of the overcoat layer may be achieved.

In the following description, for the purposes of explanation, specific details are set forth in order to provide a thorough understanding of examples of the disclosure. However, it will be apparent that various examples may be practiced without these specific details. For example, devices, systems, structures, assemblies, methods, and other components may be shown as components in block diagram form in order not to obscure the examples in unnecessary detail. In other instances, well-known devices, processes, systems, structures, and techniques may be shown without necessary detail in order to avoid obscuring the examples. The figures and description are not intended to be restrictive. The terms and expressions that have been employed in this disclosure are used as terms of description and not of limitation, and there is no intention in the use of such terms and expressions of excluding any equivalents of the features shown and described or portions thereof. The word "example" is used herein to mean "serving as an example, instance, or illustration." Any embodiment or design described herein as "example" is not necessarily to be construed as preferred or advantageous over other embodiments or designs.

FIG. 1 is a simplified diagram of an example near-eye display 100 according to certain embodiments. Near-eye display 100 may present media to a user. Examples of media presented by near-eye display 100 may include one or more images, video, and/or audio. In some embodiments, audio may be presented via an external device (e.g., speakers and/or headphones) that receives audio information from near-eye display 100, a console, or both, and presents audio data based on the audio information. Near-eye display 100 is generally configured to operate as an artificial reality display. In some embodiments, near-eye display 100 may operate as an augmented reality (AR) display or a mixed reality (MR) display.

Near-eye display 100 may include a frame 105 and a display 110. Frame 105 may be coupled to one or more optical elements. Display 110 may be configured for the user to see content presented by near-eye display 100. In some embodiments, display 110 may include a waveguide display assembly for directing light from one or more images to an eye of the user.

Figure 2:
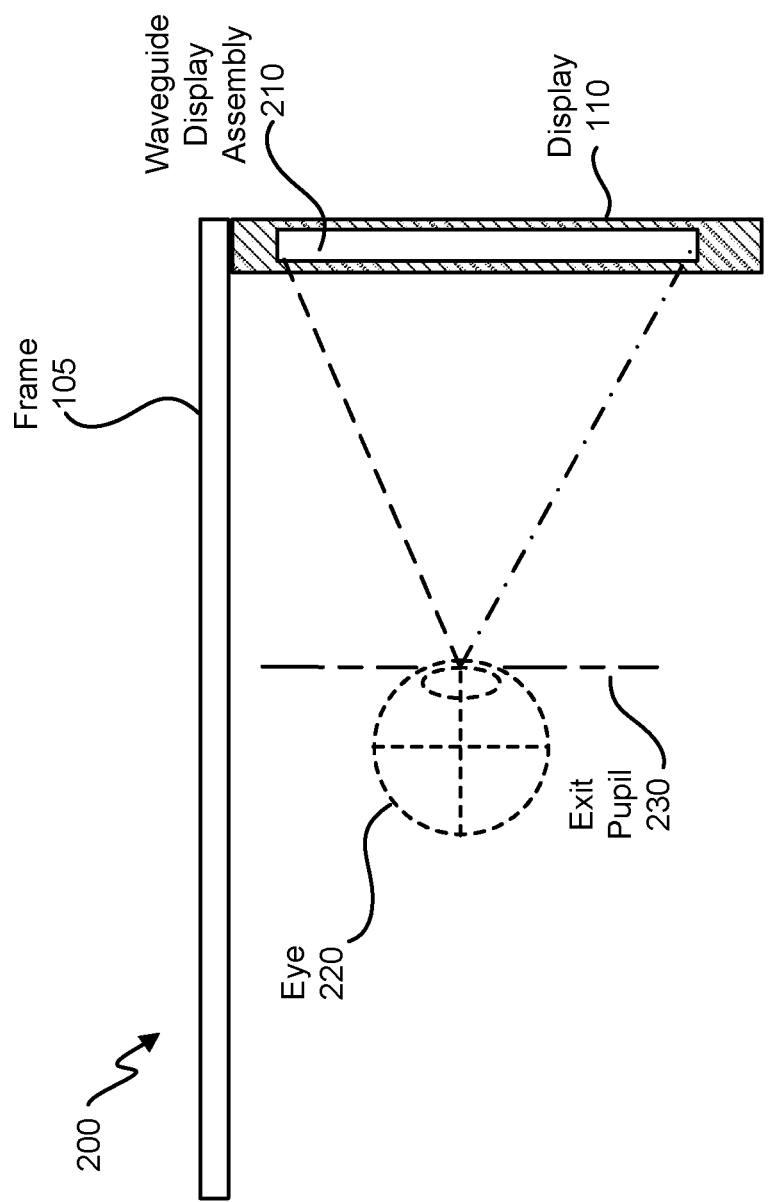
FIG. 2 is a cross-sectional view of an example near-eye display according to certain embodiments.

FIG. 2 is a cross-sectional view 200 of near-eye display 100 illustrated in FIG. 1. Display 110 may include at least one waveguide display assembly 210. An exit pupil 230 may be located at a location where a user's eye 220 is positioned when the user wears near-eye display 100. For purposes of illustration, FIG. 2 shows cross-sectional view 200 associated with user's eye 220 and a single waveguide display assembly 210, but, in some embodiments, a second waveguide display may be used for the second eye of the user.

Waveguide display assembly 210 may be configured to direct image light (i.e., display light) to an eyebox located at exit pupil 230 and to user's eye 220. Waveguide display assembly 210 may include one or more materials (e.g., plastic, glass, etc.) with one or more refractive indices. In some embodiments, near-eye display 100 may include one or more optical elements between waveguide display assembly 210 and user's eye 220.

In some embodiments, waveguide display assembly 210 may include a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display may also be a polychromatic display that can be projected on multiple planes (e.g. multi-planar colored display). In some configurations, the stacked waveguide display may be a monochromatic display that can be projected on multiple planes (e.g. multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
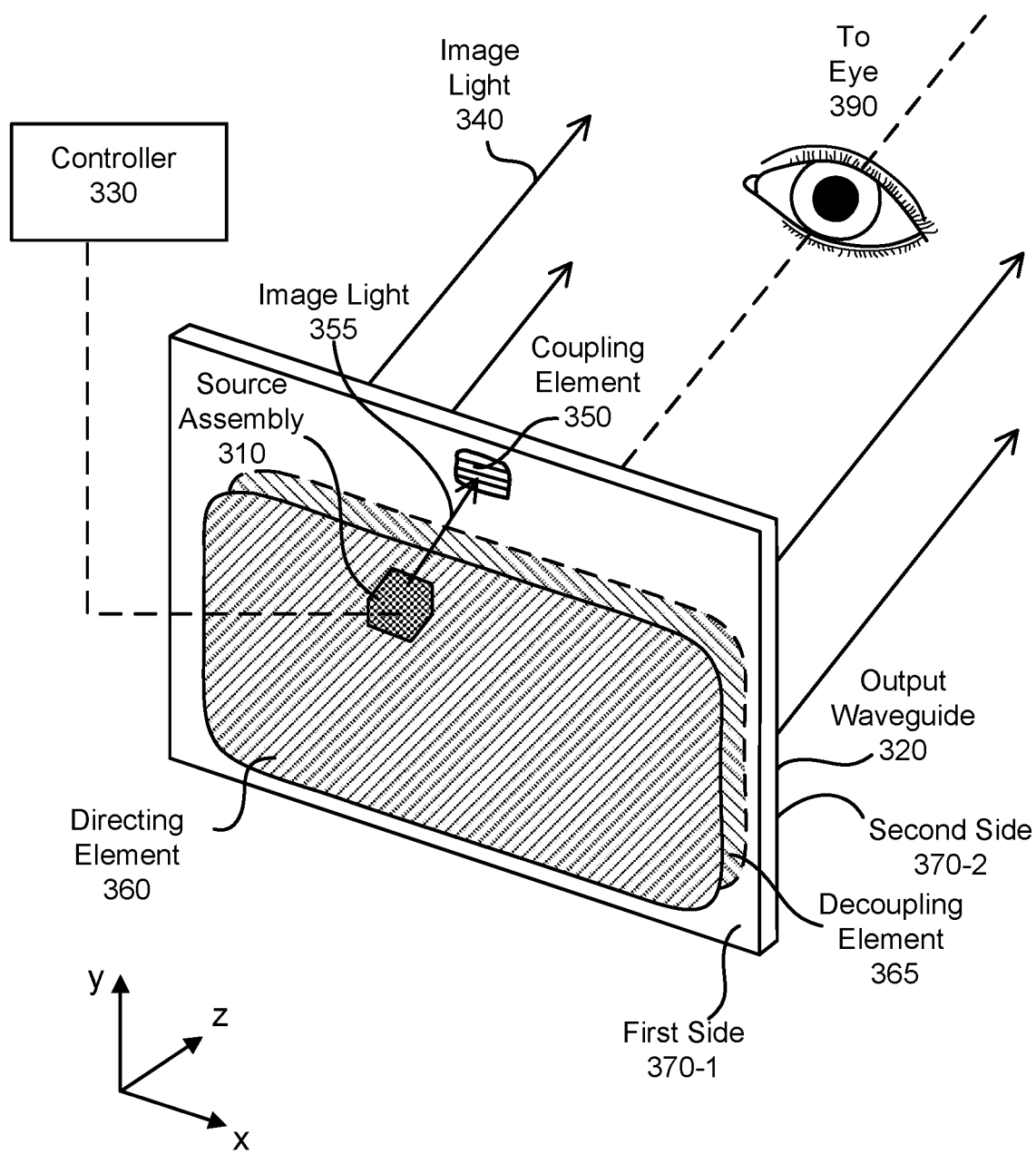
FIG. 3 is an isometric view of an example waveguide display according to certain embodiments.

FIG. 3 is an isometric view of an embodiment of a waveguide display 300. In some embodiments, waveguide display 300 may be a component (e.g., waveguide display assembly 210) of near-eye display 100. In some embodiments, waveguide display 300 may be part of some other near-eye displays or other systems that may direct image light to a particular location.

Waveguide display 300 may include a source assembly 310, an output waveguide 320, and a controller 330. For purposes of illustration, FIG. 3 shows waveguide display 300 associated with a user's eye 390, but in some embodiments, another waveguide display separate, or partially separate, from waveguide display 300 may provide image light to another eye of the user.

Source assembly 310 may generate image light 355 for display to the user. Source assembly 310 may generate and output image light 355 to a coupling element 350 located on a first side 370-1 of output waveguide 320. In some embodiments, coupling element 350 may couple image light 355 from source assembly 310 into output waveguide 320. Coupling element 350 may include, for example, a diffraction grating, a holographic grating, one or more cascaded reflectors, one or more prismatic surface elements, and/or an array of holographic reflectors. Output waveguide 320 may be an optical waveguide that can output expanded image light 340 to user's eye 390. Output waveguide 320 may receive image light 355 at one or more coupling elements 350 located on first side 370-1 and guide received image light 355 to a directing element 360.

Directing element 360 may redirect received input image light 355 to decoupling element 365 such that received input image light 355 may be coupled out of output waveguide 320 via decoupling element 365. Directing element 360 may be part of, or affixed to, first side 370-1 of output waveguide

320. Decoupling element 365 may be part of, or affixed to, a second side 370-2 of output waveguide 320, such that directing element 360 is opposed to decoupling element 365. Directing element 360 and/or decoupling element 365 may include, for example, a diffraction grating, a holographic grating, a surface-relief grating, one or more cascaded reflectors, one or more prismatic surface elements, and/or an array of holographic reflectors.

Second side 370-2 of output waveguide 320 may represent a plane along an x-dimension and a y-dimension. Output waveguide 320 may include one or more materials that can facilitate total internal reflection of image light 355. Output waveguide 320 may include, for example, silicon, plastic, glass, and/or polymers. Output waveguide 320 may have a relatively small form factor. For example, output waveguide 320 may be approximately 50 mm wide along the x-dimension, about 30 mm long along the y-dimension, and about 0.5 to 1 mm thick along a z-dimension.

Controller 330 may control scanning operations of source assembly 310. Controller 330 may determine scanning instructions for source assembly 310. In some embodiments, output waveguide 320 may output expanded image light 340 to user's eye 390 with a large field of view (FOV). For example, expanded image light 340 provided to user's eye 390 may have a diagonal FOV (in x and y) of about 60 degrees or greater and/or about 150 degrees or less. Output waveguide 320 may be configured to provide an eyebox with a length of about 20 mm or greater and/or equal to or less than about 50 mm, and/or a width of about 10 mm or greater and/or equal to or less than about 50 mm.

Figure 4:
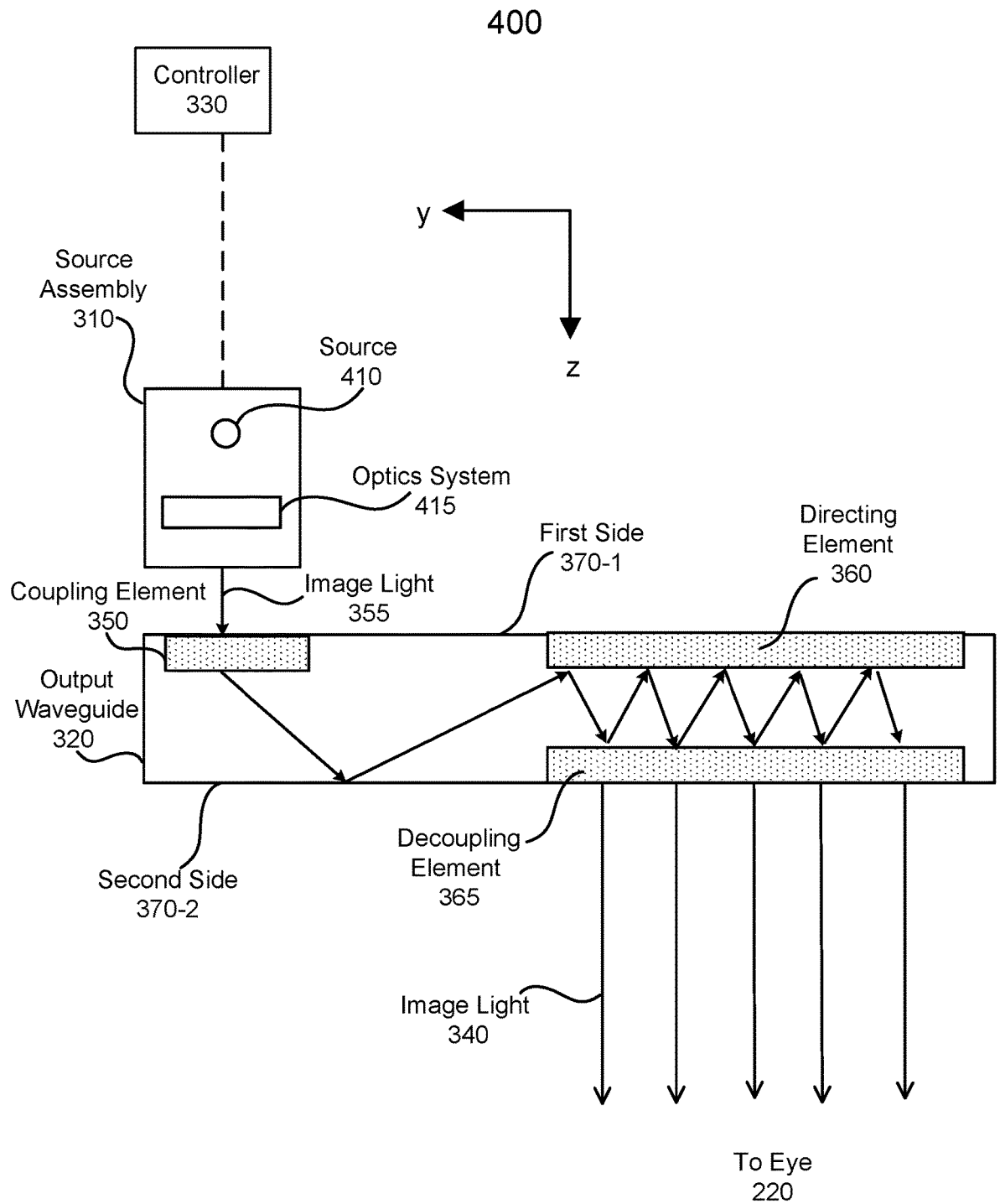
FIG. 4 is a cross-sectional view of an example waveguide display according to certain embodiments.

FIG. 4 is a cross-sectional view 400 of waveguide display 300. Waveguide display 300 may include source assembly 310 and output waveguide 320. Source assembly 310 may generate image light 355 (i.e., display light) in accordance with scanning instructions from controller 330. Source assembly 310 may include a source 410 and an optics system 415. Source 410 may include a light source that generates coherent or partially coherent light. Source 410 may include, for example, a laser diode, a vertical cavity surface emitting laser, and/or a light emitting diode.

Optics system 415 may include one or more optical components that can condition the light from source 410. Conditioning light from source 410 may include, for example, expanding, collimating, and/or adjusting orientation in accordance with instructions from controller 330. The one or more optical components may include one or more lenses, liquid lenses, mirrors, apertures, and/or gratings. Light emitted from optics system 415 (and also source assembly 310) may be referred to as image light 355 or display light.

Output waveguide 320 may receive image light 355 from source assembly 310. Coupling element 350 may couple image light 355 from source assembly 310 into output waveguide 320. In embodiments where coupling element 350 includes a diffraction grating, the diffraction grating may be configured such that total internal reflection may occur within output waveguide 320, and thus image light 355 coupled into output waveguide 320 may propagate internally within output waveguide 320 (e.g., by total internal reflection) toward decoupling element 365.

Directing element 360 may redirect image light 355 toward decoupling element 365 for coupling at least a portion of the image light out of output waveguide 320. In embodiments where directing element 360 is a diffraction grating, the diffraction grating may be configured to cause incident image light 355 to exit output waveguide 320 at angle(s) of inclination relative to a surface of decoupling element 365. In some embodiments, directing element 360 and/or the decoupling element 365 may be structurally similar.

Expanded image light 340 exiting output waveguide 320 may be expanded along one or more dimensions (e.g., elongated along the x-dimension). In some embodiments, waveguide display 300 may include a plurality of source assemblies 310 and a plurality of output waveguides 320. Each of source assemblies 310 may emit a monochromatic image light corresponding to a primary color (e.g., red, green, or blue). Each of output waveguides 320 may be stacked together to output an expanded image light 340 that may be multi-colored.

Figure 5:
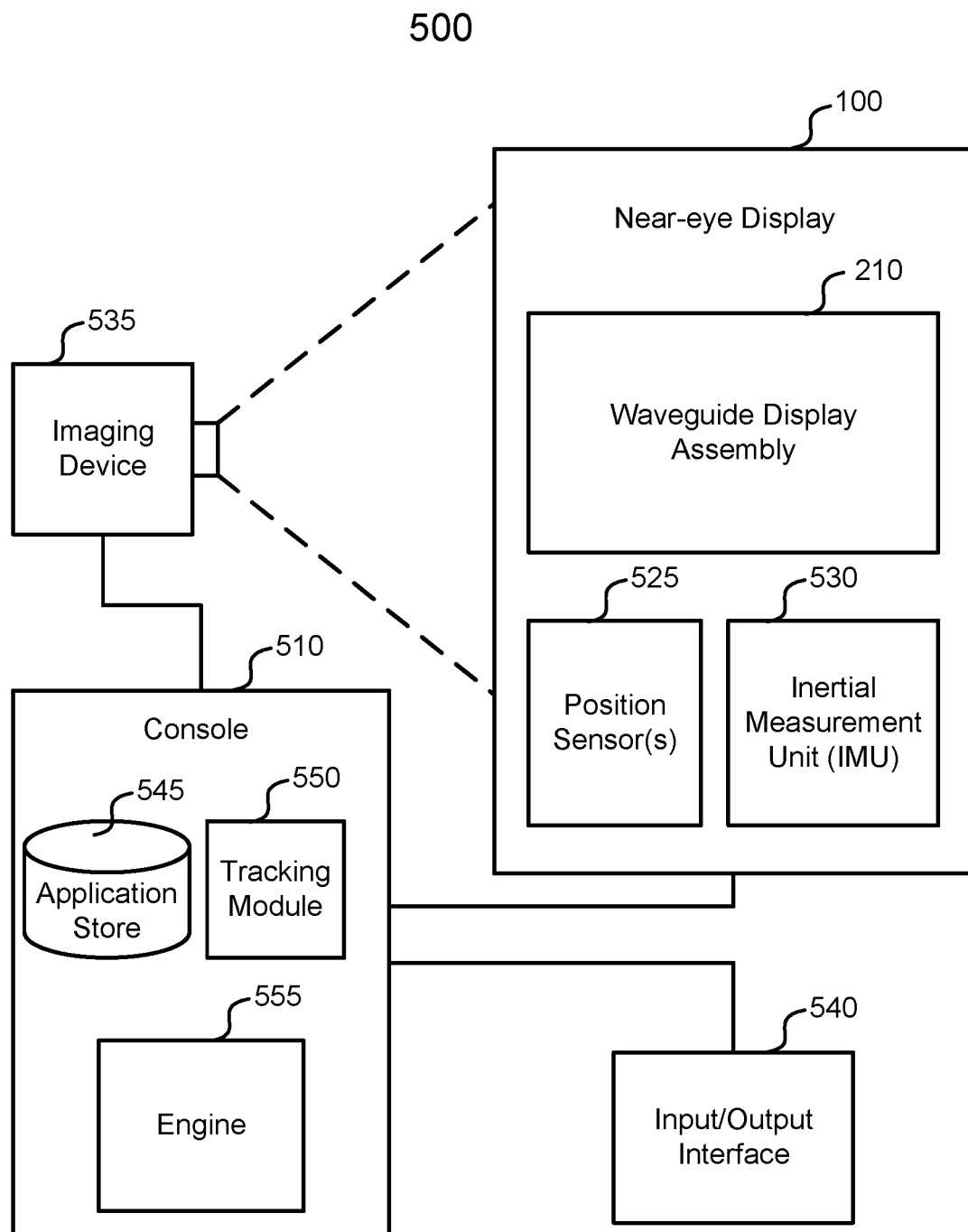
FIG. 5 is a simplified block diagram of an example artificial reality system including a waveguide display.

FIG. 5 is a simplified block diagram of an example artificial reality system 500 including waveguide display assembly 210. System 500 may include near-eye display 100, an imaging device 535, and an input/output interface 540 that are each coupled to a console 510.

As described above, near-eye display 100 may be a display that presents media to a user. Examples of media presented by near-eye display 100 may include one or more images, video, and/or audio. In some embodiments, audio may be presented via an external device (e.g., speakers and/or headphones) that may receive audio information from near-eye display 100 and/or console 510 and present audio data based on the audio information to a user. In some embodiments, near-eye display 100 may act as an artificial reality eyewear glass. For example, in some embodiments, near-eye display 100 may augment views of a physical, real-world environment, with computer-generated elements (e.g., images, video, sound, etc.).

Near-eye display 100 may include waveguide display assembly 210, one or more position sensors 525, and/or an inertial measurement unit (IMU) 530. Waveguide display assembly 210 may include a waveguide display, such as waveguide display 300 that includes source assembly 310, output waveguide 320, and controller 330 as described above.

IMU 530 may include an electronic device that can generate fast calibration data indicating an estimated position of near-eye display 100 relative to an initial position of near-eye display 100 based on measurement signals received from one or more position sensors 525.

Imaging device 535 may generate slow calibration data in accordance with calibration parameters received from console 510. Imaging device 535 may include one or more cameras and/or one or more video cameras.

Input/output interface 540 may be a device that allows a user to send action requests to console 510. An action request may be a request to perform a particular action. For example, an action request may be to start or end an application or to perform a particular action within the application.

Console 510 may provide media to near-eye display 100 for presentation to the user in accordance with information received from one or more of imaging device 535, near-eye display 100, and input/output interface 540. In the example shown in FIG. 5, console 510 may include an application store 545, a tracking module 550, and an engine 555.

Application store 545 may store one or more applications for execution by the console 510. An application may include a group of instructions that, when executed by a processor, may generate content for presentation to the user. Examples of applications may include gaming applications, conferencing applications, video playback application, or other suitable applications.

Tracking module 550 may calibrate system 500 using one or more calibration parameters and may adjust one or more calibration parameters to reduce error in determination of the position of near-eye display 100. Tracking module 550 may track movements of near-eye display 100 using slow calibration information from imaging device 535. Tracking module 550 may also determine positions of a reference point of near-eye display 100 using position information from the fast calibration information.

Engine 555 may execute applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210. The signal may determine a type of content to present to the user.

There may be many different ways to implement the waveguide display. For example, in some implementations, output waveguide 320 may include a slanted surface between first side 370-1 and second side 370-2 for coupling image light 355 into output waveguide 320. In some implementations, the slanted surface may be coated with a reflective coating to reflect light towards directing element 360. In some implementations, the angle of the slanted surface may be configured such that image light 355 may be reflected by the slanted surface due to total internal reflection. In some implementations, directing element 360 may not be used, and light may be guided within output waveguide 320 by total internal reflection. In some implementations, decoupling elements 365 may be located near first side 370-1.

In some implementations, output waveguide 320 and decoupling element 365 (and directing element 360 if used) may be transparent to light from the environment, and may act as an optical combiner for combining image light 355 and light from the physical, real-world environment in front of near-eye display 100. As such, the user can view both artificial images of artificial objects from source assembly 310 and real images of real objects in the physical, real-world environment, which may be referred to as optical see-through.

Figure 6:
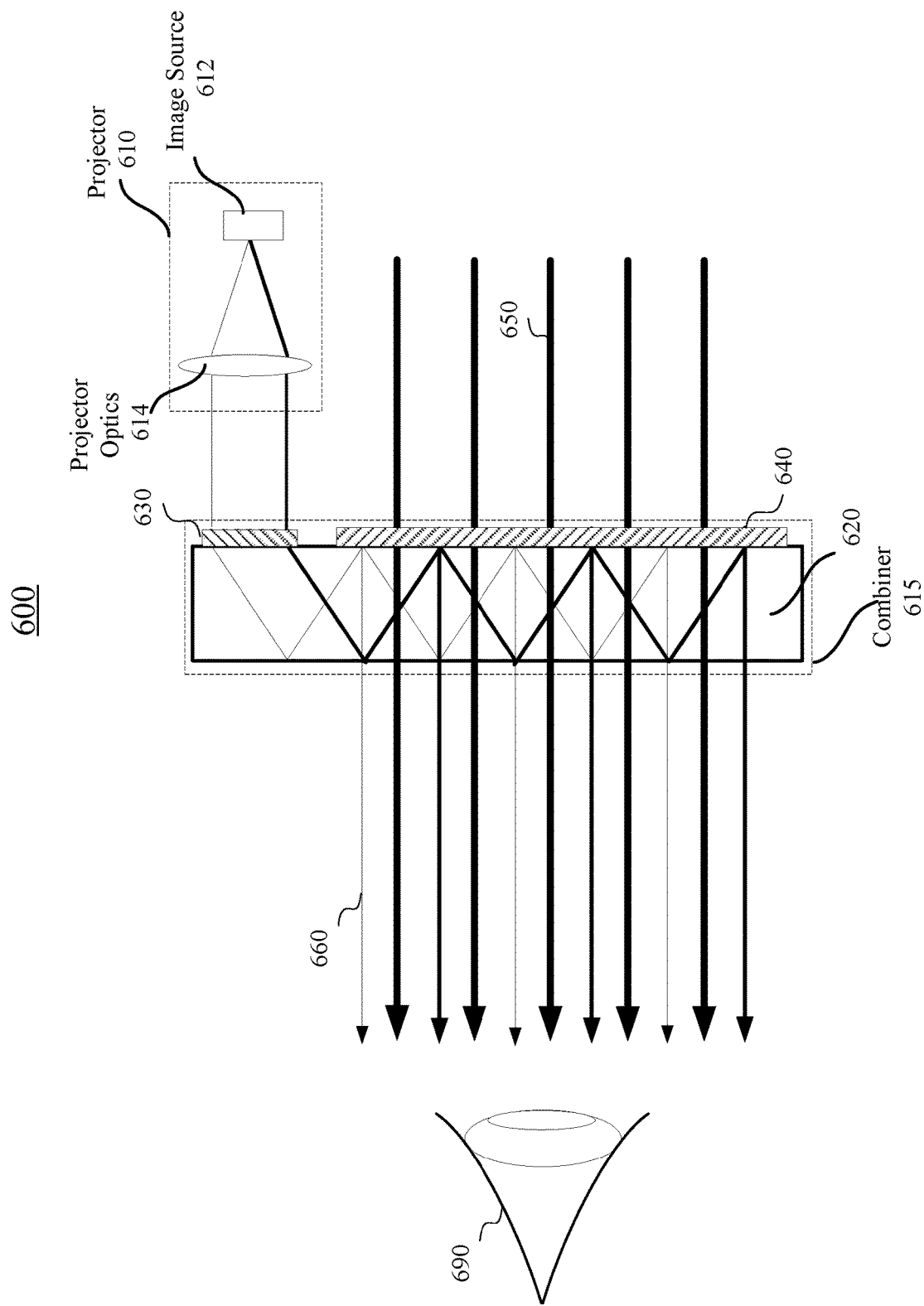
FIG. 6 illustrates an example optical see-through augmented reality system using a waveguide display according to certain embodiments.

FIG. 6 illustrates an example optical see-through augmented reality system 600 using a waveguide display according to certain embodiments. Augmented reality system 600 may include a projector 610 and a combiner 615. Projector 610 may include a light source or image source 612 and projector optics 614. In some embodiments, image source 612 may include a plurality of pixels that displays virtual objects, such as an LCD display panel or an LED display panel. In some embodiments, image source 612 may include a light source that generates coherent or partially coherent light. For example, image source 612 may include a laser diode, a vertical cavity surface emitting laser, and/or a light emitting diode. In some embodiments, image source 612 may include a plurality of light sources each emitting a monochromatic image light corresponding to a primary color (e.g., red, green, or blue). In some embodiments, image source 612 may include an optical pattern generator, such as a spatial light modulator. Projector optics 614 may include one or more optical components that can condition the light from image source 612, such as expanding, collimating, scanning, or projecting light from image source 612 to combiner 615. The one or more optical components may include, for example, one or more lenses, liquid lenses, mirrors, apertures, and/or gratings. In some embodiments, projector optics 614 may include a liquid lens (e.g., a liquid crystal lens) with a plurality of electrodes that allows scanning of the light from image source 612.

Combiner 615 may include an input coupler 630 for coupling light from projector 610 into a substrate 620 of combiner 615. Input coupler 630 may include a volume holographic grating, a diffractive optical elements (DOE) (e.g., a surface-relief grating), or a refractive coupler (e.g., a wedge or a prism). Input coupler 630 may have a coupling efficiency of greater than 30%, 50%, 75%, 90%, or higher for visible light. As used herein, visible light may refer to light with a wavelength between about 380 nm to about 750 nm. Light coupled into substrate 620 may propagate within substrate 620 through, for example, total internal reflection (TIR). Substrate 620 may be in the form of a lens of a pair of eyeglasses. Substrate 620 may have a flat or a curved surface, and may include one or more types of dielectric materials, such as glass, quartz, plastic, polymer, poly(methyl methacrylate) (PMMA), crystal, or ceramic. A thickness of the substrate may range from, for example, less than about 1 mm to about 10 mm or more. Substrate 620 may be transparent to visible light. A material may be "transparent" to a light beam if the light beam can pass through the material with a high transmission rate, such as larger than 50%, 60%, 75%, 80%, 90%, 95%, or higher, where a small portion of the light beam (e.g., less than 50%, 40%, 25%, 20%, 10%, 5%, or less) may be scattered, reflected, or absorbed by the material. The transmission rate (i.e., transmissivity) may be represented by either a photopically weighted or an unweighted average transmission rate over a range of wavelengths, or the lowest transmission rate over a range of wavelengths, such as the visible wavelength range.

Substrate 620 may include or may be coupled to a plurality of output couplers 640 configured to extract at least a portion of the light guided by and propagating within substrate 620 from substrate 620, and direct extracted light 660 to an eye 690 of the user of augmented reality system 600. As input coupler 630, output couplers 640 may include grating couplers (e.g., volume holographic gratings or surface-relief gratings), other DOEs, prisms, etc. Output couplers 640 may have different coupling (e.g., diffraction) efficiencies at different locations. Substrate 620 may also allow light 650 from environment in front of combiner 615 to pass through with little or no loss. Output couplers 640 may also allow light 650 to pass through with little loss. For example, in some implementations, output couplers 640 may have a low diffraction efficiency for light 650 such that light 650 may be refracted or otherwise pass through output couplers 640 with little loss, and thus may have a higher intensity than extracted light 660. In some implementations, output couplers 640 may have a high diffraction efficiency for light 650 and may diffract light 650 to certain desired directions (i.e., diffraction angles) with little loss. As a result, the user may be able to view combined images of the environment in front of combiner 615 and virtual objects projected by projector 610.

Figure 7:
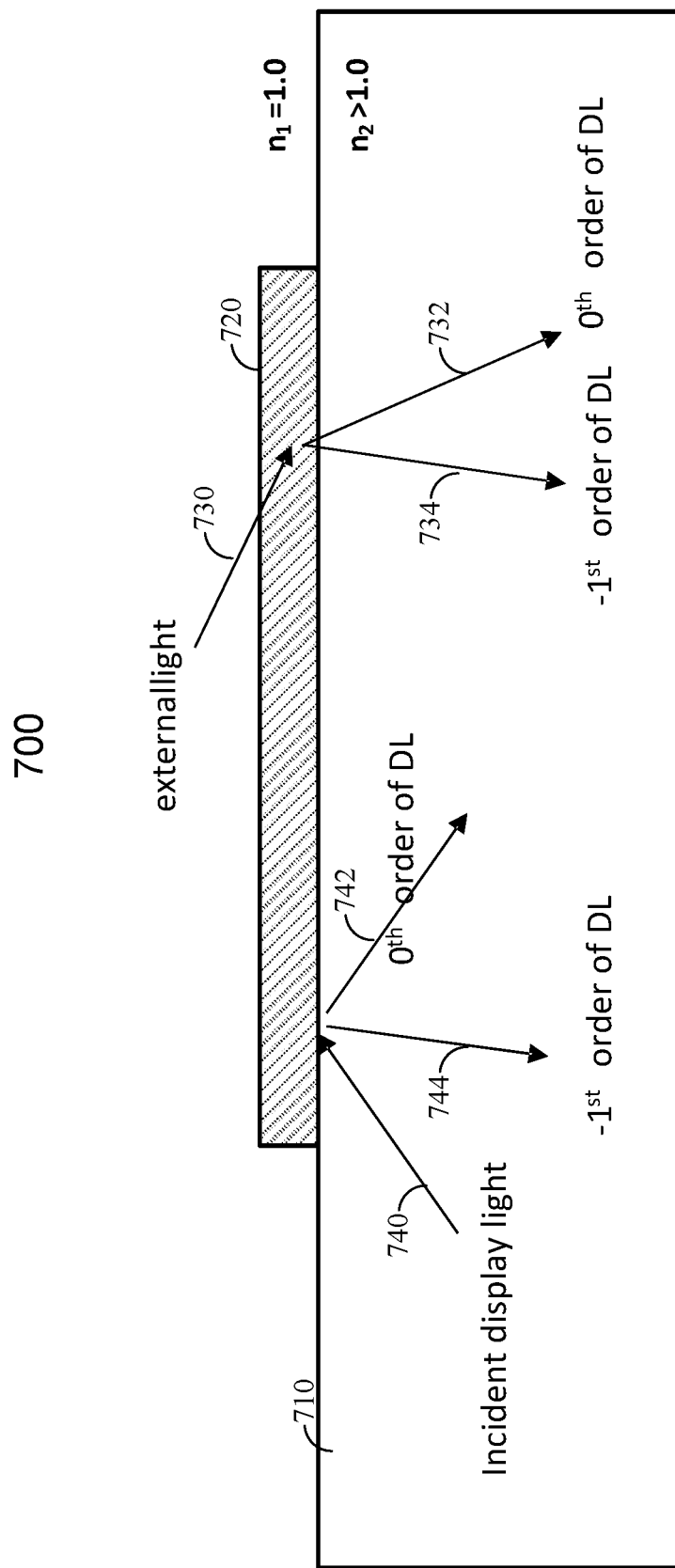
FIG. 7 illustrates propagations of display light and external light in an example waveguide display.

FIG. 7 illustrates propagations of incident display light 740 and external light 730 in an example waveguide display 700 including a waveguide 710 and a grating coupler 720. Waveguide 710 may be a flat or curved transparent substrate with a refractive index $n_2$ greater than the free space refractive index $n_1$ (i.e., 1.0). Grating coupler 720 may include, for example, a Bragg grating or a surface-relief grating.

Incident display light 740 may be coupled into waveguide 710 by, for example, input coupler 630 of FIG. 6 or other couplers (e.g., a prism or slanted surface) described above. Incident display light 740 may propagate within waveguide 710 through, for example, total internal reflection. When incident display light 740 reaches grating coupler 720, incident display light 740 may be diffracted by grating coupler 720 into, for example, a $0^{th}$ order diffraction (i.e., reflection) light 742 and a −1st order diffraction light 744. The $0^{th}$ order diffraction may continue to propagate within waveguide 710, and may be reflected by the bottom surface of waveguide 710 towards grating coupler 720 at a different location. The −1st order diffraction light 744 may be coupled (e.g., refracted) out of waveguide 710 towards the user's eye, because a total internal reflection condition may not be met at the bottom surface of waveguide 710 due to the diffraction angle of the $-1^{st}$ order diffraction light 744.

External light 730 may also be diffracted by grating coupler 720 into, for example, a $0^{th}$ order diffraction light 732 or a −1st order diffraction light 734. The $0^{th}$ order diffraction light 732 or the −1st order diffraction light 734 may be refracted out of waveguide 710 towards the user's eye. Thus, grating coupler 720 may act as an input coupler for coupling external light 730 into waveguide 710, and may also act as an output coupler for coupling incident display light 740 out of waveguide 710. As such, grating coupler 720 may act as a combiner for combining external light 730 and incident display light 740 and send the combined light to the user's eye.

In order to diffract light at a desired direction towards the user's eye and to achieve a desired diffraction efficiency for certain diffraction orders, grating coupler 720 may include a blazed or slanted grating, such as a slanted Bragg grating or surface-relief grating, where the grating ridges and grooves may be tilted relative to the surface normal of grating coupler 720 or waveguide 710.

Figure 8:
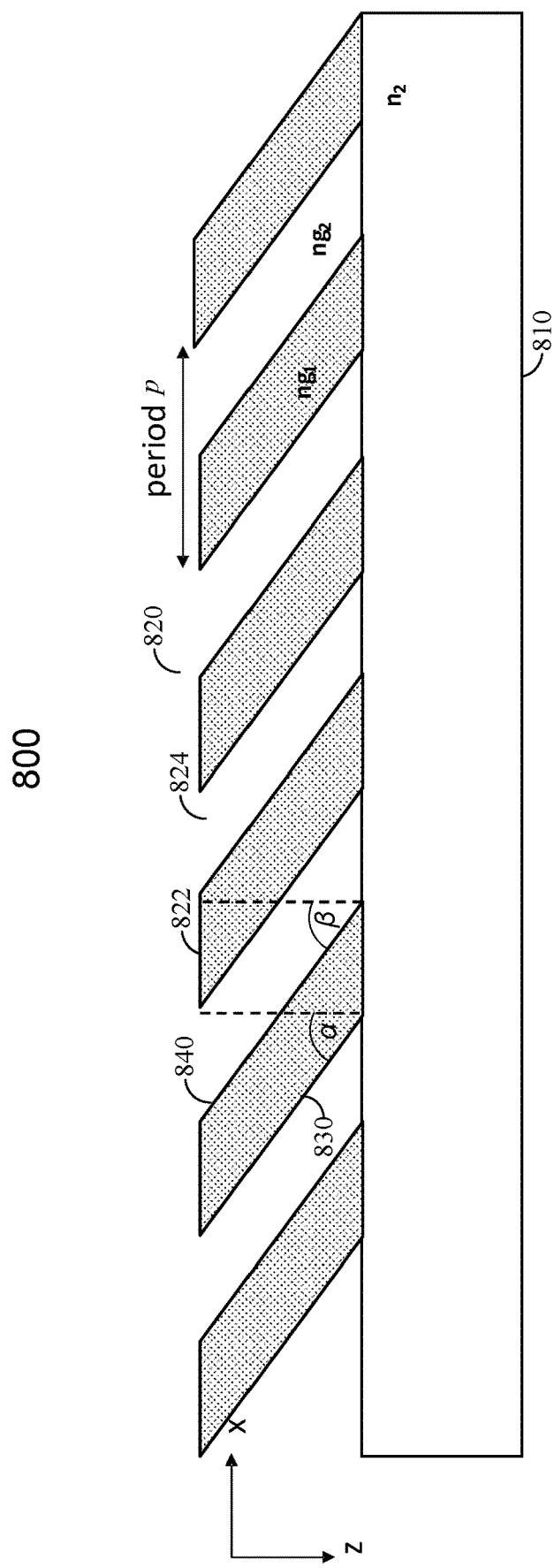
FIG. 8 illustrates an example slanted grating coupler in an example waveguide display according to certain embodiments.

FIG. 8 illustrates an example slanted grating 820 in an example waveguide display 800 according to certain embodiments. Waveguide display 800 may include slanted grating 820 on a waveguide 810, such as substrate 620. Slanted grating 820 may act as a grating coupler for couple light into or out of waveguide 810. In some embodiments, slanted grating 820 may include a periodic structure with a period p. For example, slanted grating 820 may include a plurality of ridges 822 and grooves 824 between ridges 822. Each period of slanted grating 820 may include a ridge 822 and a groove 824, which may be an air gap or a region filled with a material with a refractive index $n_{g2}$. The ratio between the width of a ridge 822 and the grating period p may be referred to as duty cycle. Slanted grating 820 may have a duty cycle ranging, for example, from about 10% to about 90% or greater. In some embodiments, the duty cycle may vary from period to period. In some embodiments, the period p of the slanted grating may vary from one area to another on slanted grating 820, or may vary from one period to another (i.e., chirped) on slanted grating 820.

Ridges 822 may be made of a material with a refractive index of $n_{g1}$, such as silicon containing materials (e.g., $SiO_2$, $Si_3N_4$, SiC, $SiO_xN_y$, or amorphous silicon), organic materials (e.g., spin on carbon (SOC) or amorphous carbon layer (ACL) or diamond like carbon (DLC)), or inorganic metal oxide layers (e.g., $TiO_x$, $AlO_x$, $TaO_x$, $HfO_x$, etc.). Each ridge 822 may include a leading edge 830 with a slant angle α and a trailing edge 840 with a slant angle β. In some embodiments, leading edge 830 and training edge 840 of each ridge 822 may be parallel to each other. In other words, slant angle α is approximately equal to slant angle β. In some embodiments, slant angle α may be different from slant angle β. In some embodiments, slant angle α may be approximately equal to slant angle β. For example, the difference between slant angle α and slant angle β may be less than 20%, 10%, 5%, 1%, or less. In some embodiments, slant angle α and slant angle β may range from, for example, about 30° or less to about 70° or larger. In some embodiments, the slant angle α and/or slant angle β may be greater than 30°, 45°, 50°, 70°, or larger.

The slanted grating 820 may be fabricated using many different nanofabrication techniques. The nanofabrication techniques generally include a patterning process and a post-patterning (e.g., overcoating) process. The patterning process may be used to form slanted ridges 822 of the slanted grating 820. There may be many different nanofabrication techniques for forming the slanted ridges 822. For example, in some implementations, the slanted grating 820 may be fabricated using lithography techniques including slanted etching. In some implementations, the slanted grating 820 may be fabricated using nanoimprint lithography (NIL) from a master mold.

The post-patterning process may be used to overcoat the slanted ridges 822 and/or to fill the grooves 824 between the slanted ridges 822 with a material having a refractive index $n_{g2}$ different from the refractive index $n_{g1}$ of the slanted ridges 822. The post-patterning process may be independent from the patterning process. Thus, a same post-patterning process may be used on slanted gratings fabricated using any pattering technique.

Figure 9A:
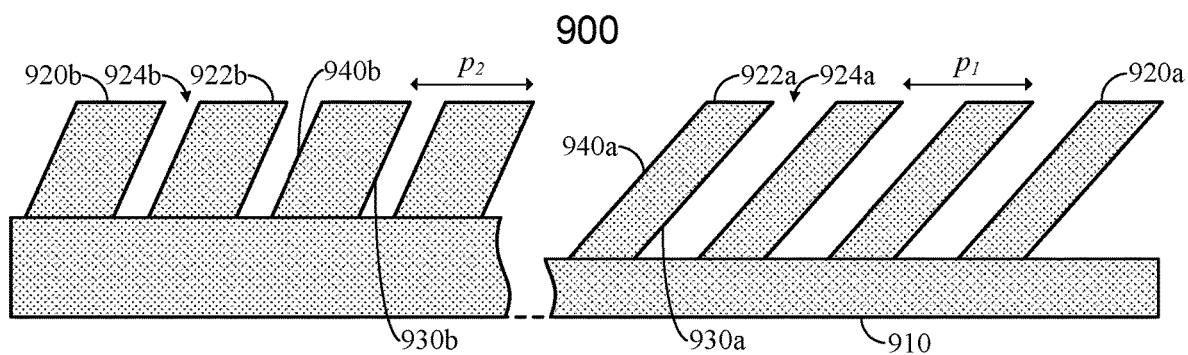
FIG. 9A illustrates an example slanted grating coupler in an example waveguide display according to certain embodiments.

FIG. 9A illustrates an example of a slanted grating coupler in a waveguide display 900 according to certain embodiments. The waveguide display 900 may include slanted surface-relief structures, such as slanted gratings 920 on a substrate 910, such as a waveguide. As discussed above and also shown in FIG. 9A, the configuration of the slanted gratings 920 may vary across the substrate 910 so as to increase the coupling efficiency of the light to user's eyes. For example, some slanted gratings 920a may include a period $p_1$ that may be different from the period $p_2$ of other slanted gratings 920b. The height of the ridges 922a and 922b, the depth of the grooves 924a and 924b, and the slant angles of the leading edges 930a and 930b and the trailing edges 940a and 940b of the ridges 922a and 922b may also vary. The width of the ridges 922a and 922b and/or the width of the grooves 924a and 924b may further be varied, leading to varied duty cycles of the slanted gratings 920a and 920b. The varied configuration of the slanted gratings 920 may pose challenges to overcoat the slanted gratings 920 uniformly and/or to form a substantially planar top surface of the overcoat layer.

Common techniques for applying an overcoat may include spin coating techniques. Generally, spin-coating techniques may work well to overcoat a relatively flat surface. However, it may be challenging to achieve a uniform overcoat layer when the surface to be coated may include structures formed thereon, and it may be even more difficult to overcoat all exposed surfaces when the configuration of the surface structures may be varied across the surface, such as the varying configuration of the slanted gratings 920, or when some exposed surfaces may be shadowed by other surfaces and/or structures, such as trailing edges 940 and/or leading edges 930 of the slanted ridges 922. The resulting thickness of an overcoat layer applied on the slanted gratings 920 using spin-coating techniques may vary, which can lead to an uneven or non-planar surface of the overcoat layer. The unevenness of the surface of the overcoat layer can cause significant loss of coupled light. Further, solvent or air trapping may occur in the grooves 924 when spin-coating techniques may be employed. For example, the solvent used for spin coating the overcoat material may not completely evaporate. Air may also be trapped in the overcoat layer. The trapped solvent and/or air may result in a varying refractive index of the overcoat layer and efficiency loss of the device. The problems may be exacerbated when the grooves 924 may be relatively deep, e.g., 100 nm, 200 nm, 300 nm or greater in some embodiments, the grooves 924 may be relatively narrow, and/or the slant angles of the ridges 922 may be relatively large. In some embodiments, the slant angle may be greater than 30°, 45°, 50°, 70°, or larger.

To overcome these issues, different techniques for applying an overcoat over the slanted gratings 920 may be implemented. In some embodiments, a cyclic coating or deposition process may be employed to fill the grooves 924 and/or to overcoat the ridges 922. Specifically, instead of applying an overcoat material to achieve a desired thickness of an overcoat layer all in once, the overcoat layer may be formed in multiple cycles, and during each cycle, only a relatively thin layer of the overcoat material may be applied to partially fill the grooves 924 and/or to overcoat the ridges 922. A desired thickness of the overcoat layer may be achieved through two or more cycles of the overcoat material application.

In some embodiments, the overcoat material may be applied or deposited using atomic layer deposition (ALD) in each cycle. Specifically, once the slanted gratings 920 may be formed using any suitable techniques, the substrate 910 having the slanted gratings 920 formed thereon may be transferred to a processing chamber for application or deposition of the overcoat material. The slanted gratings 920 may be formed in the same processing chamber in which the overcoat material may be applied or deposited or may be formed in a different processing chamber. The processing chamber may be configured to apply or deposit the overcoat material in a cyclic manner. The processing chamber may be further configured to apply or deposit the overcoat material in a controlled amount during each cycle, including depositing the overcoat material using ALD in some embodiments. Accordingly, in some embodiments, only a thin layer which may include two or more atomic layers of the overcoat material may be deposited in each cycle. In some embodiments, only one atomic layer of the overcoat material may be deposited in each cycle. The overcoat material may be deposited in a layer-by-layer fashion in two or more cycles to achieve a desired overall thickness of the overcoat layer.

Figure 9B:
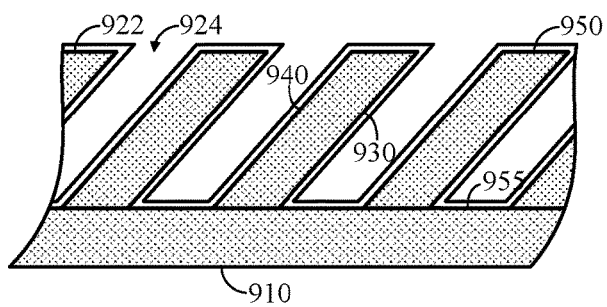
FIG. 9B illustrates the example slanted grating coupler of FIG. 9A that has been coated with a layer of overcoat material according to certain embodiments.

FIG. 9B illustrates the example slanted grating coupler of FIG. 9A that has been coated with a layer of overcoat material according to certain embodiments. As illustrated, because the overcoat material may be deposited in a layer-by-layer fashion, as the deposition progresses, the thickness of the overcoat material deposited on the top 950 of the ridges 922 may be maintained to be substantially uniform. Further, when performing ALD, the pressure of the processing chamber may be maintained relatively low, such as close to vacuum. Under vacuum condition, the molecules forming the overcoat material may be adsorbed on all exposed surfaces that may be oriented at any angle. Accordingly, during deposition of the overcoat material using ALD, the molecules forming the overcoat may not only be adsorbed on the top 950 of the ridges 922, but may also be adsorbed on the surfaces of the leading edges 930 and trailing edges 940 of the ridges 922, as well as the bottom 955 of the grooves 924. Upon completion of one cycle, one continuous atomic layer of the overcoat material may be deposited or formed on the top 950 of the ridges 922, as well as inside the grooves 924 and on the leading edges 930 and the trailing edges 940 of the ridges 922. As mentioned above, it may be difficult to overcoat the leading edges 930 of the ridges 922 partly because the leading edges 930, the trailing edges 940, and/or the bottom 955 of the grooves 924 may be shadowed by the ridges 922. By using ALD, the molecules forming the overcoat material may be able to reach and to be uniformly adsorbed on the leading edges 930, the trailing edges 940, and/or the bottom 955 of the grooves 924. Accordingly, a uniform overcoat may be obtained by using ALD even when the slant angles of the leading edges 930 and/or the trailing edges 940 may be extremely high, such as greater than or about 30°, greater than or about 35°, greater than or about 40°, greater than or about 45°, greater than or about 50°, greater than or about 55°, greater than or about 60°, greater than or about 65°, greater than or about 70°, greater than or about 75°, greater than or about 80°, or greater.

As two or more cycles of the overcoat material application using ALD may be performed, the thickness of the overcoat material deposited on the top 950 of the ridges 922, the thickness of the overcoat material deposited on the leading edges 930 and the trailing edges 940 of the ridges 922, and the thickness of the overcoat material deposited on the bottom 955 of the grooves 924 may grow or increase at substantially the same or similar rate. Consequently, a substantially uniform thickness of the overcoat material on all exposed surfaces may be maintained during the deposition process, as illustrated in FIG. 9B, and the deposited overcoat material may reduce the depth of the grooves 924 and the width of the grooves 924 simultaneously.

Figure 9C:
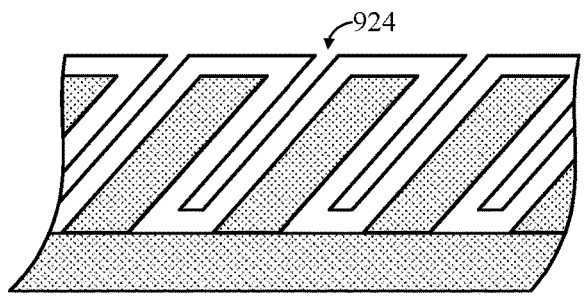
FIG. 9C illustrates the example slanted grating coupler of FIGS. 9A and 9B that has been coated with additional overcoat material according to certain embodiments.

FIG. 9C illustrates the example slanted grating coupler of FIGS. 9A and 9B that has been coated with additional overcoat material according to certain embodiments. As shown, with more cycles of the deposition being performed, the uniformity in the thickness of the overcoat material on all exposed surfaces may be maintained during the deposition process. The depth of the grooves 924 and the width of the grooves 924 may be further reduced simultaneously.

Figure 9D:
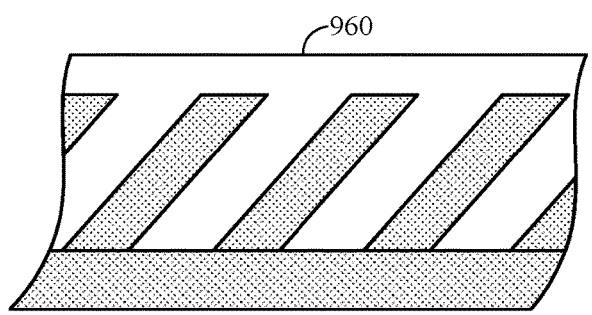
FIG. 9D illustrates the example slanted grating coupler of FIGS. 9A-9C that has been further coated with additional overcoat material to form a planar overcoat layer according to certain embodiments.

FIG. 9D illustrates the example slanted grating coupler of FIGS. 9A-9C that has been further coated with additional overcoat material to form a planar overcoat layer according to certain embodiments. As shown, with further cycles of the deposition being performed, the gaps between adjacent ridges 922 may be eliminated, the grooves 924 may be completely filled by the overcoat material, and a continuous surface 960 of the overcoat layer may be formed by the overcoat material.

Because the overcoat material may be deposited in a layer-by-layer fashion, and in some embodiments, the top 950 of the individual slanted gratings 920a and 920b may be at the same height or elevation with respect to a bottom surface of the substrate 910 as shown in FIG. 9A, the continuous surface 960 of the overcoat layer may be of the same height or elevation, and thus may be substantially flat or planar when the grooves 924 may be filled. In some embodiments, the surface 960 may include no surface irregularities and thus is flat or planar. In some embodiments, the surface 960 may still include minor degree of surface irregularities, such as protrusions or dips. The depth of the dips or height of the protrusions may be a few tens of nanometers to less than a few nanometers, may be less than 10 nm, less than 9 nm, less than 8 nm, less than 7 nm, less than 6 nm, less than 5 nm, less than 4 nm, less than 3 nm, less than 2 nm, less than 1 nm, less than 0.5 nm, or less in various embodiments.

Depending on the applications, even when the surface 960 may include minor degree of surface irregularities, the surface 960 may still be considered flat or planar, or substantially flat or planar. For example, in some embodiments, when the depth of the dips or height of the protrusions may be less than 1% of the associated period p of the slanted gratings 920, the surface 960 may be considered flat or planar. Depending on the applications, the surface 960 may be considered flat or planar when the depth of the dips or height of the protrusions may be less than 5% of the associated period p of the slanted gratings 920 in some embodiments, and may be considered flat or planar when the depth of the dips or height of the protrusions may be less than 4%, less than 3%, less than 2%, less than 1%, less than 0.5%, or less than 0.1% of the associated period p of the slanted gratings 920 in various embodiments.

In some embodiments, one or more additional cycles of overcoat material application may be performed to increase the thickness of the overcoat layer. Because the surface 960 of the overcoat layer may be substantially planar, the additional deposition may be performed using ALD or other physical and/or chemical techniques, including spin-coating techniques, to still maintain and achieve a substantially planar top surface of the overcoat layer.

Although ALD is described herein as an exemplary technique for filling the grooves 924 of the slanted gratings 920, other deposition techniques, such as other chemical vapor deposition (CVD) and/or physical vapor deposition (PVD) techniques, may be utilized to deposit the overcoat material in a cyclic manner. During each cycle, only a small amount of the materials forming the overcoat layer may be flowed into the processing chamber to deposit a thin layer of the overcoat material on the ridges 922 and inside the grooves 924. Consequently, the surface profile of the deposited overcoat material layer may be improved as compared to the surface profile obtained using conventional spin-coating techniques. In some embodiments, the chamber component supporting the substrate 910 with the slanted gratings 920 formed thereon may be tilted so as to expose the grooves 924 to the incoming flow of the overcoat material to further facilitate uniform deposition inside the grooves 924.

As compared to applying the overcoat material all in once using conventional spin-coating techniques, forming the overcoat layer in a cyclic manner, whether using ALD or other CVD or PVD techniques, may generally improve the surface profile. Application of the overcoat material using ALD may allow for even greater control over the surface profile of the overcoat as compared to other CVD or PVD techniques because only one atomic layer, i.e., about 0.5 nm thick, of the overcoat material may be deposited during each cycle. Accordingly, the variation of the thickness deposited in each cycle may be less than 0.5 nm. Consequently, the variation of the overall thickness of the overcoat may be extremely small, and may be within a few nanometers or less.

In addition to improved top surface uniformity, by depositing the overcoat material in a layer-by-layer fashion using ALD, a consistent refractive index throughout the overcoat may also be achieved. Specifically, by using ALD to deposit the overcoat material inside the grooves 924 layer by layer, the grooves 924 may be filled by the overcoat material with substantially no void. As discussed above, applying an overcoat using spin-coating techniques may result in solvent or air trapping in the grooves 924, especially when the grooves 924 may be relatively deep and/or narrow. The solvent or air trapped inside the grooves 924 can lead to refractive index variation inside the overcoat, which can further lead to efficiency loss of the device. By applying the overcoat using ALD, no solvent may be introduced, and no air trapping may occur, and thus, consistent and/or uniform refractive index throughout the overcoat may be obtained, which may further lead to improved device efficiency.

The overcoat material may be substantially visibly transparent. Depending on the applications, the overcoat material may have a refractive index higher or lower than the refractive index of the material forming the ridges 922. In some embodiments, the material forming the ridges 922 may include one of amorphous silicon, silicon oxide, silicon nitride, silicon carbide, silicon oxynitride (SiOxNy), spin on carbon (SOC), amorphous carbon, diamond like carbon (DLC), titanium oxide, aluminum oxide, tantalum oxide, or hafnium oxide. In some embodiments, a high refractive index material, such as hafnium oxide, titanium oxide, tantalum oxide, tungsten oxide, zirconium oxide, gallium sulfide, gallium nitride, gallium phosphide, silicon, silicon nitride, and a high refractive index polymer, may be used to fill the grooves 924. In some embodiments, a low refractive index material, such as silicon oxide, alumina, porous silica, or fluorinated low index monomer (or polymer), may be used to fill the grooves 924. As a result, the difference between the refractive index of the ridges 922 and the refractive index of the grooves 924 filled with the overcoat material may be greater than 0.01, 0.05, 0.1, 0.2, 0.3, 0.5, 1.0, or higher. The overcoat material and the ridges 922 may collectively function to couple light into and out of the substrate 910.

Figure 10:
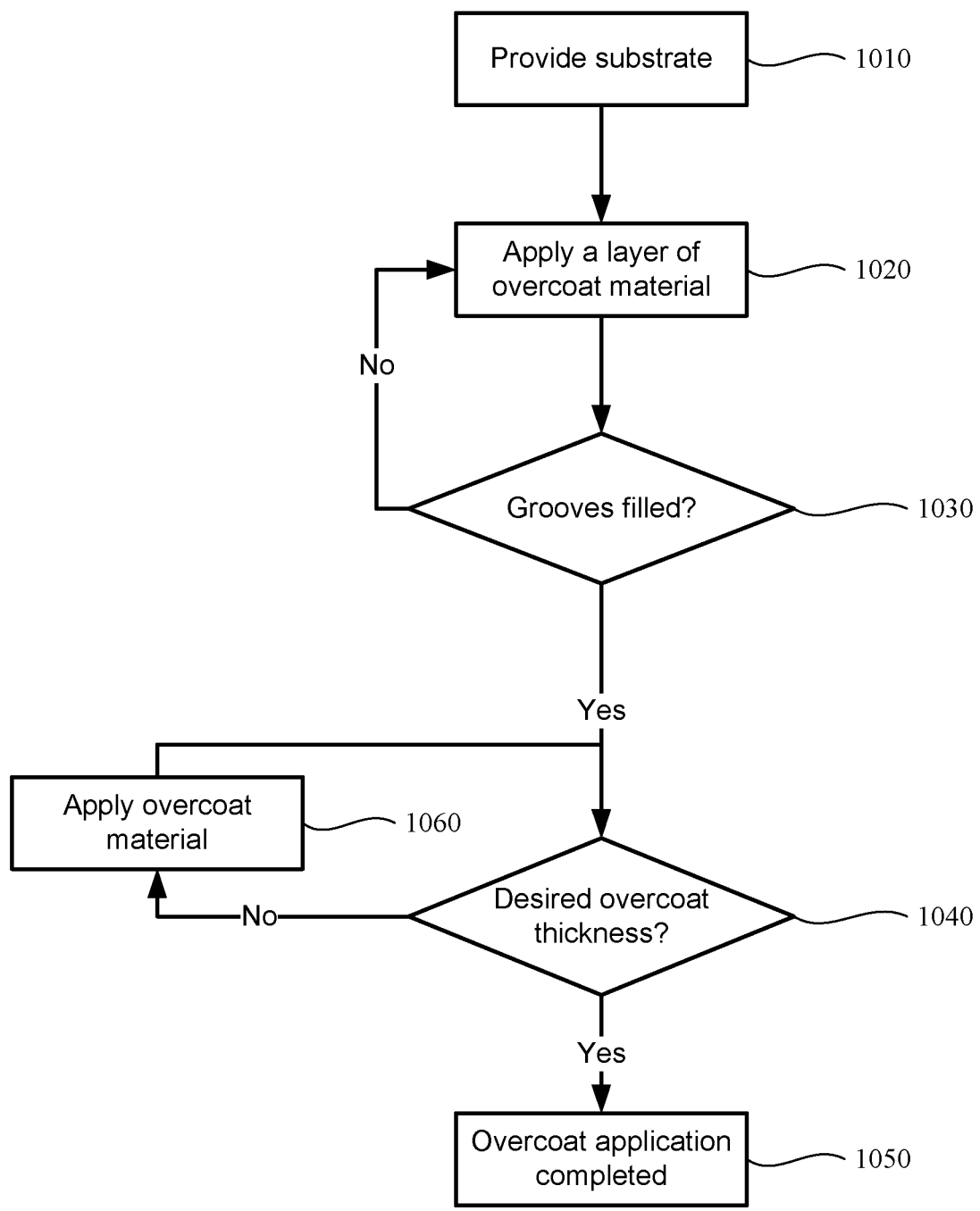
FIG. 10 is a simplified flow chart illustrating an example process for overcoating a slanted surface-relief structure according to certain embodiments.

FIG. 10 is a simplified flow chart 1000 illustrating an exemplary method of applying an overcoat layer to a substrate according to certain embodiments. The operations described in flow chart 1000 are for illustration purposes only and are not intended to be limiting.

At block 1010, a substrate may be provided into a processing chamber. The substrate may include surface-relief structures similar to those described above with reference to FIGS. 8 and 9. Accordingly, the substrate may include slanted gratings having slanted ridges and grooves. The configuration of the slanted ridges and grooves may vary across the substrate as discussed above. The processing chamber for the overcoat layer application may be the same as or different from the processing chamber in which the slanted gratings may be formed. Accordingly, the substrate having the slanted gratings formed thereon may be already in the processing chamber before block 1010. Alternatively, the substrate may be loaded into the processing chamber at block 1010 for application of the overcoat layer.

At block 1020, a layer of an overcoat material may be deposited onto the substrate to at least partially fill the grooves of the slanted gratings. In some embodiments, the processing chamber may be configured to apply or deposit the overcoat material in a controlled amount. Thus, a thin layer of the overcoat material may be deposited at block 1020. Depending on the deposition techniques used and/or the operating parameters of each technique, the thin layer of the overcoat material may include one atomic layer of the overcoat material in some embodiments, and may include a few atomic layers (i.e., two or more atomic layers) of the overcoat material in some embodiments. When two or more atomic layers of the overcoat material may be deposited, the overall thickness of the overcoat material deposited may be controlled by determining or controlling the number of atomic layers of the overcoat material deposited and/or by determining or controlling the thickness of each overcoat material layer deposited at block 1020, depending on the deposition technique implemented.

In some embodiments, the processing chamber may be configured to deposit the overcoat material using ALD. Thus, one atomic layer of the overcoat material may be deposited at block 1020. As discussed above, when ALD may be implemented, the overcoat material may be evenly coated or applied on all exposed surfaces, including surfaces that may be shadowed by other structures on the substrate. Consequently, depositing the overcoat material using ALD may achieve a substantially smooth or planar top surface of the overcoat layer, and improve the refractive index consistency throughout the overcoat layer. However, other deposition techniques that may allow for thin-layer deposition, such as other chemical vapor deposition (CVD) and/or physical vapor deposition (PVD) techniques, may also be implemented. In some embodiments, the chamber component configured to support the substrate may be tilted so as to expose any shadowed surfaces, such as the surfaces defining the sidewalls and/or bottom of the grooves, to further facilitate even coating or application of the overcoat material on all exposed surfaces.

At block 1030, it may be determined whether the grooves are substantially filled by the overcoat material. In some embodiments, the operation at block 1030 may not be performed until several layers of the overcoat material have been deposited. In other words, the operation at block 1030 may not be performed until the deposition operation at block 1020 have been performed for multiple times or multiple cycles. For example, the number of layers of the overcoat material needed to fill the grooves may be estimated such that the operation at block 1030 may be performed after the deposition operation at block 1020 has been repeated for the estimated number of cycles or close to the estimated number of cycles. Depending on the applications, the grooves may be considered as being substantially filled by the overcoat material when at least about 70%, at least about 75%, at least about 80%, at least about 85%, at least about 90%, at least about 91%, at least about 92%, at least about 93%, at least about 94%, at least about 95%, at least about 96%, at least about 97%, at least about 98%, at least about 99%, or about 100% of the depth of the grooves may be filled by the overcoat material.

If at block 1030, it is determined that the grooves have not been substantially filled by the overcoat material, then the process may proceed to block 1020 to deposit one or more additional layers of the overcoat material. The operations at block 1020 and block 1030 may be repeated until the grooves may be substantially filled by the overcoat material. If at block 1030, it is determined that the grooves have been substantially filled by the overcoat material, then the method may proceed to block 1040.

At block 1040, it may be determined whether a desired thickness of the overcoat layer has been achieved. In some embodiments, it may be desirable to deposit the overcoat material to not only fill the grooves but also to form an overcoat layer that has a thickness above the top of the ridges. Depending on the applications, the desired thickness of the overcoat layer above the top of the ridges may be greater than or about 5% of the height of the ridges in some embodiments, and may be greater than or about 10%, greater than or about 15%, greater than or about 20%, greater than or about 25%, greater than or about 30%, greater than or about 35%, greater than or about 40%, greater than or about 45%, greater than or about 50%, or greater percentage of the height of the ridges in various embodiments. The height of a ridge may be defined as the distance between the top of the ridge and the bottom of the adjacent groove along the normal of the substrate on which the slanted gratings may be formed.

In some embodiments, substantially filling the grooves and depositing a desired thickness of the overcoat layer above the top of the ridges may be achieved simultaneously. As discussed above with reference to FIGS. 9A-9C, as the overcoat material may be deposited to fill the grooves, the overcoat material may also be deposited on the top of the ridges. When the grooves may be substantially filled by the overcoat material, a continuous layer of the overcoat material may also be formed above the top of ridges as shown in FIG. 9C. Accordingly, when it may be determined whether the grooves have been substantially filled, a determination as to whether a desired thickness of the overcoat layer may be achieved may be performed at the same time. In other words, the operation performed at block 1030 and the operation performed at block 1040 may be performed simultaneously or may be performed in one operation.

If at block 1040, it is determined that the desired overcoat layer thickness above the top of the ridges has been achieved, then the process may proceed to block 1050, and the overcoat layer application may be completed. Upon completion of the overcoat layer application, the substrate may be further processed in the same processing chamber or may be removed from the processing chamber.

If at block 1040, it is determined that the desired overcoat layer thickness above the top of the ridges has not been achieved, then the method may proceed to block 1060 to deposit additional overcoat material. The additional overcoat material may be the same as or different from the overcoat material applied at block 1020. If different overcoat materials may be used at block 1020 and block 1060, the two different overcoat materials may have matching refractive index. In some embodiments, the operation performed at block 1060 may be substantially the same as or similar to the operation performed at block 1020. The overcoat material may be deposited using the same or similar deposition techniques utilized at block 1020, including ALD or other PVD or CVD deposition method. Thus, at block 1060, an additional layer of the overcoat material may be deposited, and the additional layer may be one atomic layer of the overcoat material, or two or more atomic layers of the overcoat material, or a predetermined thickness of the overcoat material deposited.

In some embodiments, the operation performed at block 1060 may be different from the operation performed at block 1020. The operation performed at block 1060 may use a different deposition technique and/or may use different operating or deposition parameters for the same deposition technique. Specifically, when the method may proceed to block 1060, the grooves may be already substantially filled by the overcoat material, and there may be substantially less variation in the surface profile of the substrate as compared to the substrate with no overcoat material. Accordingly, the overcoat material may be deposited at a faster deposition rate at block 1060 as compared to the deposition rate controlled at block 1020. Therefore, the deposition technique utilized at block 1060 may include ALD to achieve a substantially planar top surface of the overcoat layer in some embodiments. In some embodiments, the deposition technique utilized at block 1060 may include other PVD or CVD deposition techniques while still maintaining the surface evenness that has been obtained through cycles of deposition operation performed at block 1020. In some embodiments, a spin-coating technique may even be utilized at block 1060. The issues with conventional spin-coating techniques, such as solvent or air trapping in the grooves and/or unevenness in the coating obtained, may be minimized or substantially avoided because of the significantly improved surface evenness obtained after cycles of deposition operation performed at block 1020. Operations of block 1040 and block 1060 may be repeated in two or more cycles until the desired thickness of the overcoat layer above the top of the ridges is obtained, and then the overcoat layer application may be completed at block 1050.

Figure 11:
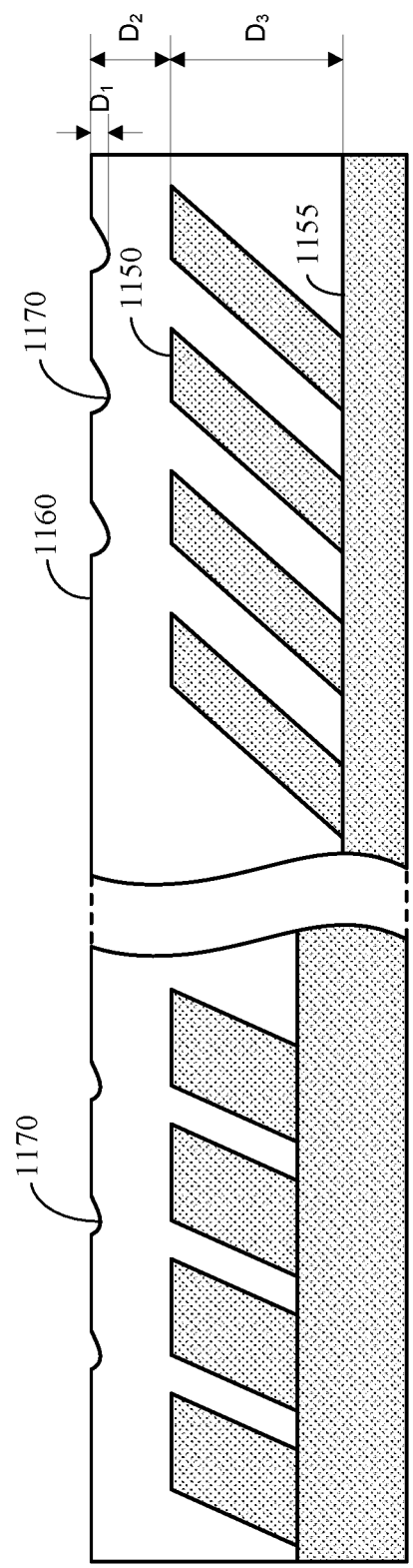
FIG. 11 illustrates an example of a slanted surface-relief structure with an overcoat layer according to certain embodiments.

With reference to FIG. 11, in some embodiments, surface variation, such as dips 1170 may still be formed on the top surface 1160 of the overcoat material upon completion of the cyclic deposition process, including when the overcoat material may be deposited using ALD. The dips 1170 may be formed partly due to the capability or limitation of the processing chamber, the deposition technique employed, and/or the variation in the structure of the slanted gratings. Nonetheless, the dips 1170 may be significantly shallower than those formed using conventional spin-coating techniques. Further, depending on the specific applications, the overcoat formed using the method described herein, even with the dips 1170 formed thereon, may still be within device tolerance and thus can be used to couple light in and out of the waveguide substrate. Further, the dips 1170 may be generally formed where the grooves are disposed or aligned with the grooves, and thus may be formed at known locations and/or may appear periodically. Accordingly, the dips 1170 formed using the deposition method described herein, including ALD as described herein, may be utilized as functional structures for light coupling and/or other purposes.

Depending on the techniques used, the depth $D_1$ of the dips 1170 may vary. The depth $D_1$ of the dips 1170 may also vary depending on the structure of the slanted gratings, such as the duty cycles of the slanted gratings, the width of the ridges and/or the grooves, the slant angles of the leading and trailing edges of the ridges, etc. Further, the corners of the ridges may be rounded in some embodiments, which may also affect the structure and/or depth of the dips 1170. A ratio of the depth $D_1$ of the dips 1170 to the thickness $D_2$ of the overcoat material between the top surface 1160 of the overcoat and the top 1150 of the ridges may be less than or about 1:2, less than or about 1:3, less than or about 1:4, less than or about 1:5, less than or about 1:6, less than or about 1:7, less than or about 1:8, less than or about 1:9, less than or about 1:10, less than or about 1:20, less than or about 1:30, less than or about 1:40, or less.

The thickness $D_2$ of the overcoat material over the top 1150 of the ridges may depend on the period and/or duty cycle of the slanted gratings in some embodiments. For example, to overcoat slanted gratings with a relatively large period and/or a relatively small duty cycle, the overcoat material over the top 1150 of the ridges may have a greater thickness $D_2$ so as to form a continuous overcoat layer above the ridges. Conversely, to overcoat slanted gratings with a relatively small period and/or a relatively large duty cycle, the overcoat material over the top 1150 of the ridges may have a lesser thickness $D_2$ to form a continuous overcoat layer above the ridges. As discussed above, the period and/or the duty cycle of the slanted gratings may vary across the substrate. The thickness $D_2$ of the overcoat material to be deposited over the top 1150 may be determined based on the varying period and/or duty cycle such that a continuous overcoat layer may be formed over the slanted gratings across the entire substrate.

A ratio of the depth $D_1$ of the dips 1170 to the depth $D_3$ of the grooves as defined as the distance between the top 1150 of the adjacent ridges and the bottom 1155 of the grooves may be less than or about 1:5, less than or about 1:6, less than or about 1:7, less than or about 1:8, less than or about 1:9, less than or about 1:10, less than or about 1:20, less than or about 1:30, less than or about 1:40, less than or about 1:50, less than or about 1:60, or less. A ratio of the thickness $D_2$ of the overcoat material between the top surface 1160 of the overcoat and the top 1150 of the ridges and the depth $D_3$ of the grooves may be less than or about 1:2, less than or about 1:3, less than or about 1:5, less than or about 1:10, less than or about 1:20, less than or about 1:30, less than or about 1:40, less than or about 1:50, less than or about 1:60, less than or about 1:70, less than or about 1:80, less than or about 1:90, less than or about 1:100, or less.

In some implementations, the depth $D_3$ of the grooves may be greater than or about 100 nm, greater than or about 150 nm, greater than or about 200 nm, greater than or about 250 nm, greater than or about 300 nm, or greater. The thickness $D_2$ of the overcoat material between the top surface 1160 of the overcoat and the top 1150 of the ridges may be greater than or about 10 nm, greater than or about 20 nm, greater than or about 30 nm, greater than or about 40 nm, greater than or about 50 nm, greater than or about 100 nm, greater than or about 150 nm, greater than or about 200 nm, or greater.

In some embodiments, the depth $D_1$ of the dips 1170 may be less than or about 100 nm, less than or about 95 nm, less than or about 90 nm, less than or about 85 nm, less than or about 80 nm, less than or about 75 nm, less than or about 70 nm, less than or about 65 nm, less than or about 60 nm, less than or about 55 nm, less than or about 50 nm, or less. In some embodiments, the depth $D_1$ of the dips 1170 may be less than or about 45 nm, less than or about 40 nm, less than or about 35 nm, less than or about 30 nm, less than or about 25 nm, less than or about 20 nm, less than or about 15 nm, less than or about 10 nm, less than or about 5 nm, or less. In some embodiments, the depth $D_1$ of the dips 1170 may be about 5 nm to 100 nm. In some embodiments, the depth $D_1$ of the dips 1170 may be about 80 nm to 100 nm.

Depending on the applications, a substantially flat or planar top surface of the overcoat, similar to the surface 960 shown in FIG. 9C, may be desired. Various processes may be implemented to limit or prevent the formation of the dips. In some embodiments, to limit dip formation, deposition and etching operations may be performed in each of multiple processing cycles.

Figure 12:
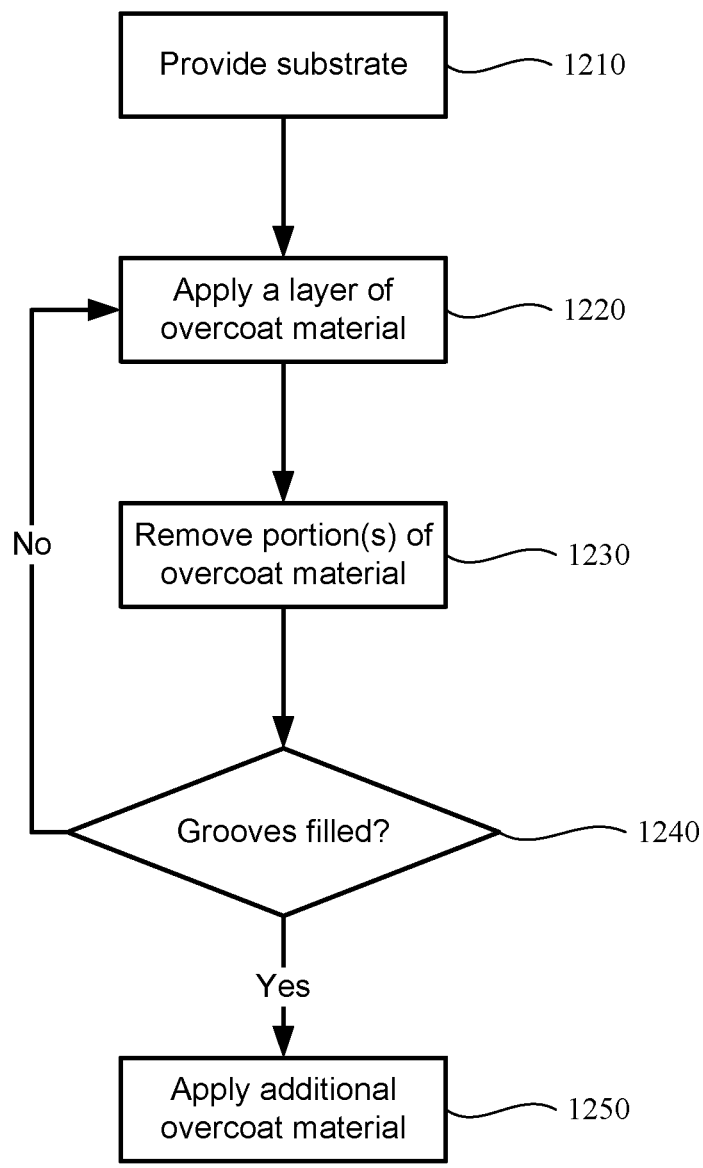
FIG. 12 is a simplified flow chart illustrating an example process for overcoating a slanted surface-relief structure according to certain embodiments.

FIG. 12 is a simplified flow chart 1200 illustrating an exemplary method of applying an overcoat layer by performing deposition and etching operations in each of multiple processing cycles according to certain embodiments. The operations described in flow chart 1200 are for illustration purposes only and are not intended to be limiting. The operations of the method shown in FIG. 12 will be described in conjunction with the schematic illustration of FIGS. 13A-13D.

At block 1210, a substrate may be provided into a processing chamber. The substrate may include surface-relief structure similar to those described above with reference to FIGS. 8 and 9. Accordingly, the substrate may include slanted gratings having slanted ridges and grooves. The configuration of the slanted ridges and grooves may vary across the substrate as discussed above. The processing chamber for the overcoat layer application may be the same as or different from the processing chamber in which the slanted gratings may be formed. Accordingly, the substrate having the slanted gratings formed thereon may be already in the processing chamber before block 1210. Alternatively, the substrate may be loaded into the processing chamber at block 1210 for application of the overcoat layer.

At block 1220, a thin layer of an overcoat material may be deposited in the initial processing cycle on the exposed surfaces of the slanted gratings. The layer may be deposited using ALD or other suitable deposition techniques described herein. For example, in some embodiments, other deposition techniques, such as other CVD and/or PVD techniques may be employed. Although the other deposition techniques may not achieve the same uniformity as an ALD process may achieve, the subsequent etching operation performed during each processing cycle (described below) may reduce the non-uniformity, and may reduce the overall depth of the dips that may be formed.

Figure 13A:
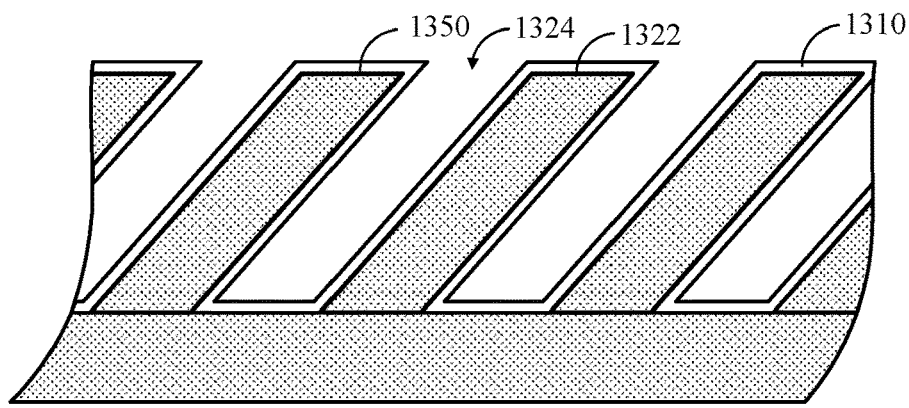
FIG. 13A illustrates an example slanted grating coupler that is coated with a layer of overcoat material according to certain embodiments.

FIG. 13A illustrates an example slanted grating coupler that is coated with a layer 1310 of overcoat material according to certain embodiments. When ALD may be used, the thin layer 1310 may include at least about 5 atomic layers of the overcoat material in some embodiments, and may include at least about 10 atomic layers, at least about 20 atomic layers, at least about 30 atomic layers, at least about 40 atomic layers, at least about 50 atomic layers, or more atomic layers of the overcoat material in various embodiments. Alternatively, the overcoat material may be deposited until the layer 1310 reaches a predetermined thickness. For example, the overcoat material may be deposited until the layer 1310 may be at least about 1 nm, at least about 2 nm, at least about 3 nm, at least about 4 nm, at least about 5 nm, at least about 10 nm, at least about 15 nm, at least about 20 nm, at least about 25 nm, at least about 30 nm, at least about 35 nm, at least about 40 nm, at least about 45 nm, at least about 50 nm, or greater in various embodiments.

At block 1230, an etching operation may be performed to remove at least portions of the overcoat material deposited in the preceding deposition operation. In some embodiments, the etching operation may be performed such that the overcoat material deposited on the top 1350 of the slanted gratings may be removed at a faster rate than the rate at which the overcoat material deposited inside the grooves 1324 may be removed.

Figure 13B:
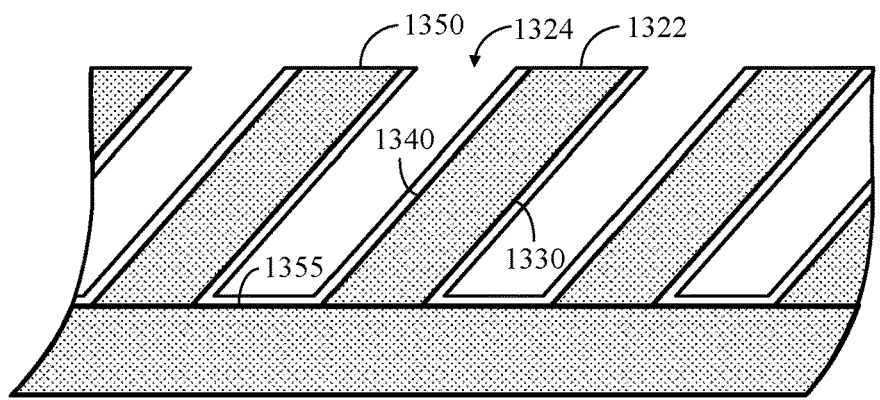
FIG. 13B illustrates the example slanted grating coupler of FIG. 13A, where portions of the layer of overcoat material have been removed according to certain embodiments.

FIG. 13B illustrates the example slanted grating coupler of FIG. 13A, where portions of the layer of overcoat material have been removed according to certain embodiments. In some embodiments, the operating conditions of the etching operation may be controlled such that substantially all of the overcoat material deposited on the top 1350 of the ridges 1322 may be removed while only a very limited amount of the overcoat material deposited inside the grooves 1324 may be removed. For example, the operating conditions may be controlled such that anisotropic etching may be achieved. Anisotropic etching may be achieved by controlling the flow of the etchants. In some embodiments, the etchants may be flowed towards the slanted gratings in a direction generally perpendicular to the top 1350 of the ridges 1322. In some embodiments, the etchants may be flowed towards the trailing edges 1340 of the ridges 1322 but away from the leading edges 1330 of the ridges 1322. Consequently, the overcoat material deposited on the top 1350 of the ridges 1322 may be etched or removed, while the etching of the overcoat material deposited on the leading edges 1330 of the ridges 1322 may be limited. The etching of the overcoat material deposited on the trailing edges 1340 of the ridges 1322 may also be limited because the slanted orientation of the ridges 1322 may block or limit the etchants that may reach the trailing edge 1340 of an adjacent ridge 1322. The slanted orientation of the ridges 1322 may also limit the amount of the overcoat material that may reach the bottom 1355 of the grooves 1324. Increasing the temperature and/or pressure of the processing chamber may also limit the amount of the etchants that may travel inside the grooves 1324, resulting less of the overcoat material inside the grooves 1324 being etched.

In some embodiments, the thickness of the overcoat material inside the grooves 1324 that may be removed in an etching operation may be less than or about 50%, less than or about 40%, less than or about 30%, less than or about 20%, less than or about 10%, less than or about 5%, less than or about 3%, less than or about 2%, less than or about 1%, or less of the thickness of the overcoat material deposited during the preceding deposition operation. The thickness of the overcoat material on the top 1350 of the ridges 1322 that may be removed in an etching operation may be greater than or about 50%, greater than or about 60%, greater than or about 70%, greater than or about 80%, greater than or about 90%, greater than or about 95%, or about 100% of the thickness of the overcoat material deposited during the preceding deposition operation.

At block 1240, it may be determined whether the grooves are substantially filled by the overcoat material. In some embodiments, operation at block 1240 may not be performed until several cycles of the deposition and etching operations have been performed. Depending on the applications, the grooves may be considered as being substantially filled by the overcoat material when at least about 70%, at least about 75%, at least about 80%, at least about 85%, at least about 90%, at least about 91%, at least about 92%, at least about 93%, at least about 94%, at least about 95%, at least about 96%, at least about 97%, at least about 98%, at least about 99%, or about 100% of the depth of the grooves may be filled by the overcoat material. If at block 1240, it is determined that the grooves have not been substantially filled by the overcoat material, then the process may proceed to block 1210 to deposit another layer of the overcoat material, followed by another etching operation at block 1230.

In some embodiments, the amount of the overcoat material deposited during the deposition operation may remain the same from cycle to cycle, and the amount of the overcoat material removed during the etching operation may also remain the same from cycle to cycle. In some embodiments, at least one or both of the amount of the overcoat material deposited and/or the amount of the overcoat material removed may vary from cycle to cycle. In some embodiments, the duration of the deposition operation may remain the same from cycle to cycle, and the duration of the etching operation may also remain the same from cycle to cycle. In some embodiments, at least one or both of the duration of the deposition and/or the duration of the etching operations may vary from cycle to cycle.

Figure 13C:
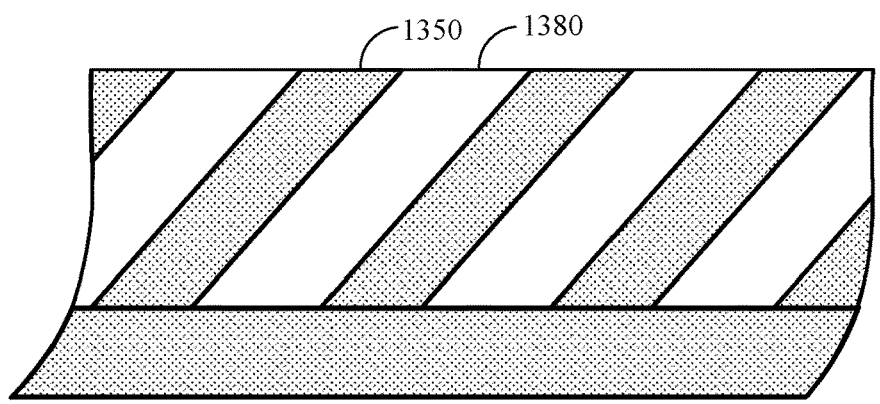
FIG. 13C illustrates the example slanted grating coupler of FIGS. 13A and 13B that has been coated with additional overcoat material according to certain embodiments.

FIG. 13C illustrates the example slanted grating coupler of FIGS. 13A and 13B that has been coated with additional overcoat material according to certain embodiments. By repeating the deposition operation and etching operation in multiple processing cycles, the grooves 1324 may be gradually filled up by the overcoat material while the overcoat material may not build up on the top 1350 of the ridges 1322, resulting in a structure similar to that shown in FIG. 13C. As shown in FIG. 13C, by implementing a cyclic process where each cycle may include a deposition operation followed by an etching operation, when the grooves 1324 may be substantially filled by the overcoat material, the top 1350 of the ridges 1322 and the top 1380 of the overcoat material filling each groove 1324 may collectively form a substantially flat or even top surface. The depth of the dips or other surface irregularities that may be formed by the overcoat material may be less than 1% of the period p of the slanted gratings in some embodiments, and may be less than 0.9%, less than 0.7%, less than 0.5%, less than 0.3%, or less than 0.1% of the period p of the slanted gratings in various embodiments.

Depending on the configuration of the gratings, the depth of the dips or other surface irregularities may be less than 5 nm, less than 4 nm, less than 3 nm, less than 2 nm, less than 1 nm, less than 0.5 nm, or less in various embodiments.

Once the grooves have been substantially filled by the overcoat material, the method may proceed to block 1250 to deposit additional overcoat material until a desired thickness of the overcoat layer above the top 1350 of the ridges 1322 may be achieved. The additional overcoat material may be the same as or different from the overcoat material applied at block 1220. If different overcoat materials may be used at block 1220 and block 1240, the two different overcoat materials may have matching refractive index. In some embodiments, the additional overcoat material may be deposited using the same or similar deposition techniques utilized at block 1220, including ALD or other PVD or CVD deposition method. In some embodiments, the additional overcoat material may be applied using a spin-coating technique because the top 1350 of the ridges 1322 and the top 1380 of the overcoat material filling each groove 1324 may be substantially level as shown in FIG. 13C.

Figure 13D:
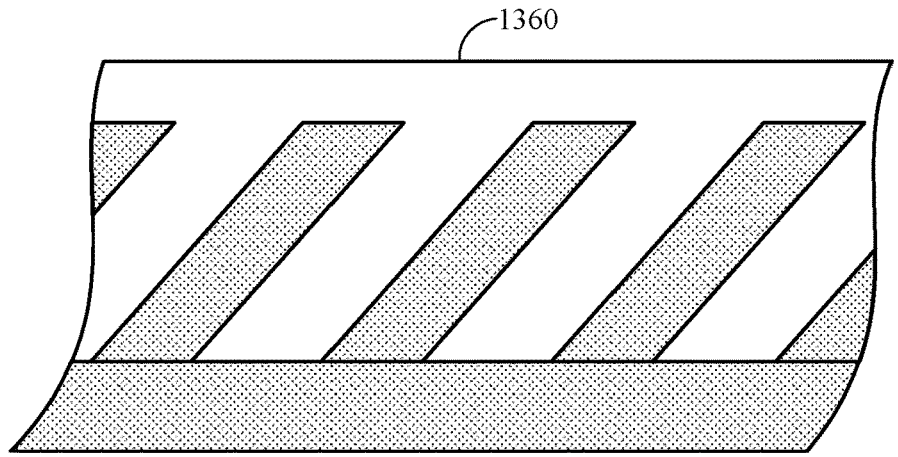
FIG. 13D illustrates the example slanted grating coupler with of FIGS. 13A-13C that has been further coated with additional overcoat material to form a planar overcoat layer according to certain embodiments.

FIG. 13D illustrates the example slanted grating coupler with of FIGS. 13A-13C that has been further coated with additional overcoat material to form a planar overcoat layer according to certain embodiments. As illustrated, upon completion the deposition of the additional overcoat material, a substantially flat or planar top surface 1360 of the overcoat layer, similar to that shown in FIG. 9C, may be achieved with substantially no dips formed. If any dips or other surface irregularities may be formed, depending on the techniques used to apply the additional overcoat material, the dimension of the surface irregularities may be less than 1%, less than 0.9%, less than 0.7%, less than 0.5%, less than 0.3%, or less than 0.1% of the period p of the slanted gratings in various embodiments, and may be less than 5 nm, less than 4 nm, less than 3 nm, less than 2 nm, less than 1 nm, less than 0.5 nm, or less in various embodiments.

The various technologies described herein allow for integration of extreme slant structures with an overcoat layer and flexibility in selecting the refractive index of the overcoat material. The technologies described herein can minimize thickness variation, and a substantially planar top surface of the overcoat may be obtained. The technologies described herein may also reduce or eliminate vertical refractive index variation of the overcoat layer.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

Figure 14:
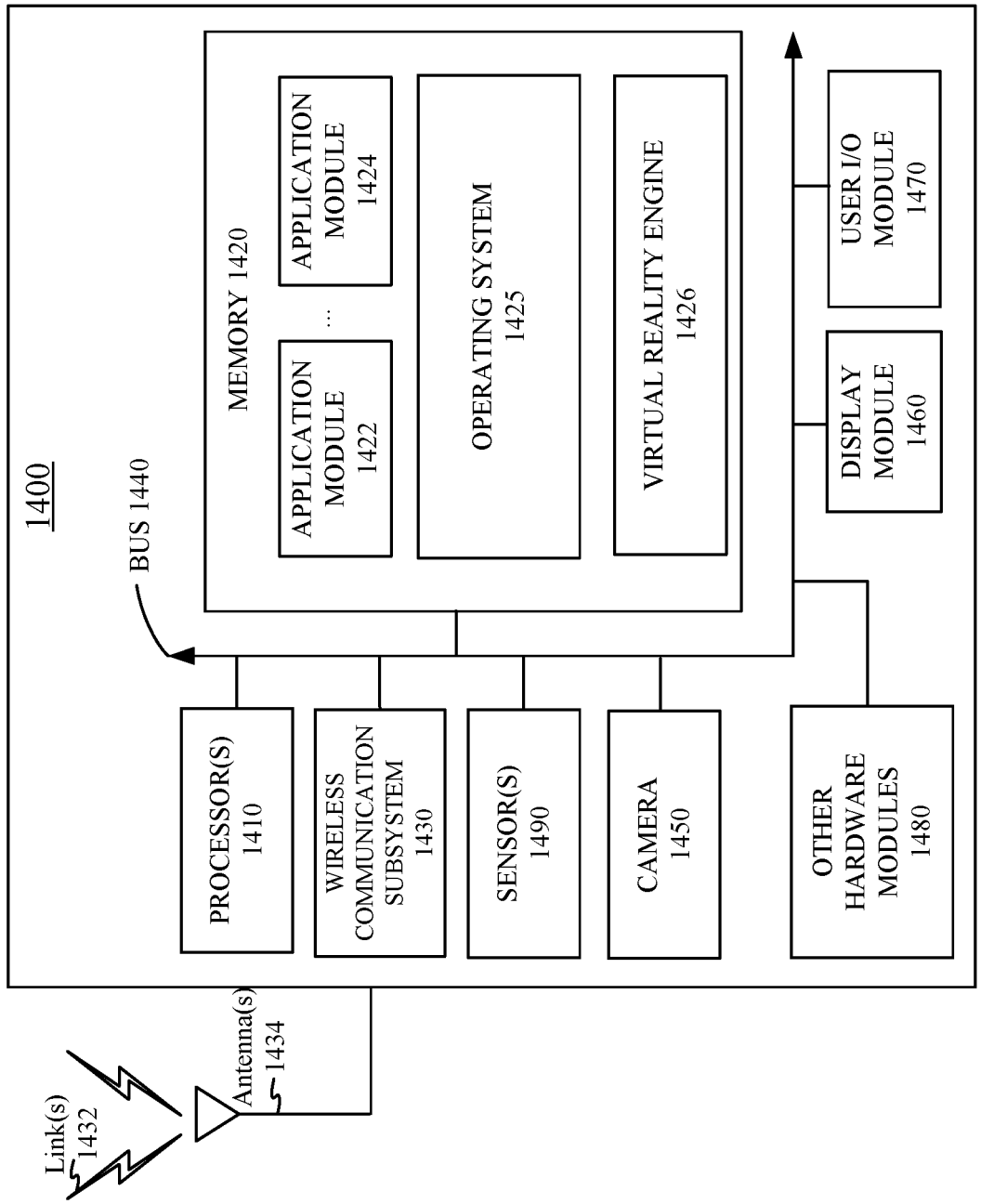
FIG. 14 is a simplified block diagram of an example electronic system of an example near-eye display according to certain embodiments.

FIG. 14 is a simplified block diagram of an example electronic system 1400 of an example near-eye display (e.g., HMD device) for implementing some of the examples disclosed herein. Electronic system 1400 may be used as the electronic system of an HMD device or other near-eye displays described above. In this example, electronic system 1400 may include one or more processor(s) 1410 and a memory 1420. Processor(s) 1410 may be configured to execute instructions for performing operations at a number of components, and can be, for example, a general-purpose processor or microprocessor suitable for implementation within a portable electronic device. Processor(s) 1410 may be communicatively coupled with a plurality of components within electronic system 1400. To realize this communicative coupling, processor(s) 1410 may communicate with the other illustrated components across a bus 1440. Bus 1440 may be any subsystem adapted to transfer data within electronic system 1400. Bus 1440 may include a plurality of computer buses and additional circuitry to transfer data.

Memory 1420 may be coupled to processor(s) 1410. In some embodiments, memory 1420 may offer both short-term and long-term storage and may be divided into several units. Memory 1420 may be volatile, such as static random access memory (SRAM) and/or dynamic random access memory (DRAM) and/or non-volatile, such as read-only memory (ROM), flash memory, and the like. Furthermore, memory 1420 may include removable storage devices, such as secure digital (SD) cards. Memory 1420 may provide storage of computer-readable instructions, data structures, program modules, and other data for electronic system 1400. In some embodiments, memory 1420 may be distributed into different hardware modules. A set of instructions and/or code might be stored on memory 1420. The instructions might take the form of executable code that may be executable by electronic system 1400, and/or might take the form of source and/or installable code, which, upon compilation and/or installation on electronic system 1400 (e.g., using any of a variety of generally available compilers, installation programs, compression/decompression utilities, etc.), may take the form of executable code.

In some embodiments, memory 1420 may store a plurality of application modules 1422 through 1424, which may include any number of applications. Examples of applications may include gaming applications, conferencing applications, video playback applications, or other suitable applications. The applications may include a depth sensing function or eye tracking function. Application modules 1422-1424 may include particular instructions to be executed by processor(s) 1410. In some embodiments, certain applications or parts of application modules 1422-1424 may be executable by other hardware modules 1480. In certain embodiments, memory 1420 may additionally include secure memory, which may include additional security controls to prevent copying or other unauthorized access to secure information.

In some embodiments, memory 1420 may include an operating system 1425 loaded therein. Operating system 1425 may be operable to initiate the execution of the instructions provided by application modules 1422-1424 and/or manage other hardware modules 1480 as well as interfaces with a wireless communication subsystem 1430 which may include one or more wireless transceivers. Operating system 1425 may be adapted to perform other operations across the components of electronic system 1400 including threading, resource management, data storage control and other similar functionality.

Wireless communication subsystem 1430 may include, for example, an infrared communication device, a wireless communication device and/or chipset (such as a Bluetooth® device, an IEEE 802.11 device, a Wi-Fi device, a WiMax device, cellular communication facilities, etc.), and/or similar communication interfaces. Electronic system 1400 may include one or more antennas 1434 for wireless communication as part of wireless communication subsystem 1430 or as a separate component coupled to any portion of the system. Depending on desired functionality, wireless communication subsystem 1430 may include separate transceivers to communicate with base transceiver stations and other wireless devices and access points, which may include communicating with different data networks and/or network types, such as wireless wide-area networks (WWANs), wireless local area networks (WLANs), or wireless personal area networks (WPANs). A WWAN may be, for example, a WiMax (IEEE 802.16) network. A WLAN may be, for example, an IEEE 802.11x network. A WPAN may be, for example, a Bluetooth network, an IEEE 802.15x, or some other types of network. The techniques described herein may also be used for any combination of WWAN, WLAN, and/or WPAN. Wireless communications subsystem 1430 may permit data to be exchanged with a network, other computer systems, and/or any other devices described herein. Wireless communication subsystem 1430 may include a means for transmitting or receiving data, such as identifiers of HMD devices, position data, a geographic map, a heat map, photos, or videos, using antenna(s) 1434 and wireless link(s) 1432. Wireless communication subsystem 1430, processor (s) 1410, and memory 1420 may together comprise at least a part of one or more of a means for performing some functions disclosed herein.

Embodiments of electronic system 1400 may also include one or more sensors 1490. Sensor(s) 1490 may include, for example, an image sensor, an accelerometer, a pressure sensor, a temperature sensor, a proximity sensor, a magnetometer, a gyroscope, an inertial sensor (e.g., a module that combines an accelerometer and a gyroscope), an ambient light sensor, or any other similar module operable to provide sensory output and/or receive sensory input, such as a depth sensor or a position sensor. For example, in some implementations, sensor(s) 1490 may include one or more inertial measurement units (IMUs) and/or one or more position sensors. An IMU may generate calibration data indicating an estimated position of the HMD device relative to an initial position of the HMD device, based on measurement signals received from one or more of the position sensors. A position sensor may generate one or more measurement signals in response to motion of the HMD device. Examples of the position sensors may include, but are not limited to, one or more accelerometers, one or more gyroscopes, one or more magnetometers, another suitable type of sensor that detects motion, a type of sensor used for error correction of the IMU, or some combination thereof. The position sensors may be located external to the IMU, internal to the IMU, or some combination thereof. At least some sensors may use a structured light pattern for sensing.

Electronic system 1400 may include a display module 1460. Display module 1460 may be a near-eye display, and may graphically present information, such as images, videos, and various instructions, from electronic system 1400 to a user. Such information may be derived from one or more application modules 1422-1424, virtual reality engine 1426, one or more other hardware modules 1480, a combination thereof, or any other suitable means for resolving graphical content for the user (e.g., by operating system 1425). Display module 1460 may use liquid crystal display (LCD) technology, light-emitting diode (LED) technology (including, for example, OLED, ILED, mLED, AMOLED, TOLED, etc.), light emitting polymer display (LPD) technology, or some other display technology.

Electronic system 1400 may include a user input/output module 1470. User input/output module 1470 may allow a user to send action requests to electronic system 1400. An action request may be a request to perform a particular action. For example, an action request may be to start or end an application or to perform a particular action within the application. User input/output module 1470 may include one or more input devices. Example input devices may include a touchscreen, a touch pad, microphone(s), button(s), dial(s), switch(es), a keyboard, a mouse, a game controller, or any other suitable device for receiving action requests and communicating the received action requests to electronic system 1400. In some embodiments, user input/output module 1470 may provide haptic feedback to the user in accordance with instructions received from electronic system 1400. For example, the haptic feedback may be provided when an action request is received or has been performed.

Electronic system 1400 may include a camera 1450 that may be used to take photos or videos of a user, for example, for tracking the user's eye position. Camera 1450 may also be used to take photos or videos of the environment, for example, for VR, AR, or MR applications. Camera 1450 may include, for example, a complementary metal-oxide-semiconductor (CMOS) image sensor with a few millions or tens of millions of pixels. In some implementations, camera 1450 may include two or more cameras that may be used to capture 3-D images.

In some embodiments, electronic system 1400 may include a plurality of other hardware modules 1480. Each of other hardware modules 1480 may be a physical module within electronic system 1400. While each of other hardware modules 1480 may be permanently configured as a structure, some of other hardware modules 1480 may be temporarily configured to perform specific functions or temporarily activated. Examples of other hardware modules 1480 may include, for example, an audio output and/or input module (e.g., a microphone or speaker), a near field communication (NFC) module, a rechargeable battery, a battery management system, a wired/wireless battery charging system, etc. In some embodiments, one or more functions of other hardware modules 1480 may be implemented in software.

In some embodiments, memory 1420 of electronic system 1400 may also store a virtual reality engine 1426. Virtual reality engine 1426 may execute applications within electronic system 1400 and receive position information, acceleration information, velocity information, predicted future positions, or some combination thereof of the HMD device from the various sensors. In some embodiments, the information received by virtual reality engine 1426 may be used for producing a signal (e.g., display instructions) to display module 1460. For example, if the received information indicates that the user has looked to the left, virtual reality engine 1426 may generate content for the HMD device that mirrors the user's movement in a virtual environment. Additionally, virtual reality engine 1426 may perform an action within an application in response to an action request received from user input/output module 1470 and provide feedback to the user. The provided feedback may be visual, audible, or haptic feedback. In some implementations, processor(s) 1410 may include one or more GPUs that may execute virtual reality engine 1426.

In various implementations, the above-described hardware and modules may be implemented on a single device or on multiple devices that can communicate with one another using wired or wireless connections. For example, in some implementations, some components or modules, such as GPUs, virtual reality engine 1326, and applications (e.g., tracking application), may be implemented on a console separate from the head-mounted display device. In some implementations, one console may be connected to or support more than one HMD.

In alternative configurations, different and/or additional components may be included in electronic system 1300. Similarly, functionality of one or more of the components can be distributed among the components in a manner different from the manner described above. For example, in some embodiments, electronic system 1300 may be modified to include other system environments, such as an AR system environment and/or an MR environment.

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

Specific details are given in the description to provide a thorough understanding of the embodiments. However, embodiments may be practiced without these specific details. For example, well-known circuits, processes, systems, structures, and techniques have been shown without unnecessary detail in order to avoid obscuring the embodiments. This description provides example embodiments only, and is not intended to limit the scope, applicability, or configuration of the invention. Rather, the preceding description of the embodiments will provide those skilled in the art with an enabling description for implementing various embodiments. Various changes may be made in the function and arrangement of elements without departing from the spirit and scope of the present disclosure.

Also, some embodiments were described as processes depicted as flow diagrams or block diagrams. Although each may describe the operations as a sequential process, many of the operations may be performed in parallel or concurrently. In addition, the order of the operations may be rearranged. A process may have additional steps not included in the figure. Furthermore, embodiments of the methods may be implemented by hardware, software, firmware, middleware, microcode, hardware description languages, or any combination thereof. When implemented in software, firmware, middleware, or microcode, the program code or code segments to perform the associated tasks may be stored in a computer-readable medium such as a storage medium. Processors may perform the associated tasks.

It will be apparent to those skilled in the art that substantial variations may be made in accordance with specific requirements. For example, customized or special-purpose hardware might also be used, and/or particular elements might be implemented in hardware, software (including portable software, such as applets, etc.), or both. Further, connection to other computing devices such as network input/output devices may be employed.

With reference to the appended figures, components that can include memory can include non-transitory machine-readable media. The term "machine-readable medium" and "computer-readable medium" may refer to any storage medium that participates in providing data that causes a machine to operate in a specific fashion. In embodiments provided hereinabove, various machine-readable media might be involved in providing instructions/code to processing units and/or other device(s) for execution. Additionally or alternatively, the machine-readable media might be used to store and/or carry such instructions/code. In many implementations, a computer-readable medium is a physical and/or tangible storage medium. Such a medium may take many forms, including, but not limited to, non-volatile media, volatile media, and transmission media. Common forms of computer-readable media include, for example, magnetic and/or optical media such as compact disk (CD) or digital versatile disk (DVD), punch cards, paper tape, any other physical medium with patterns of holes, a RAM, a programmable read-only memory (PROM), an erasable programmable read-only memory (EPROM), a FLASH-EPROM, any other memory chip or cartridge, a carrier wave as described hereinafter, or any other medium from which a computer can read instructions and/or code. A computer program product may include code and/or machine-executable instructions that may represent a procedure, a function, a subprogram, a program, a routine, an application (App), a subroutine, a module, a software package, a class, or any combination of instructions, data structures, or program statements.

Those of skill in the art will appreciate that information and signals used to communicate the messages described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Terms, "and" and "or" as used herein, may include a variety of meanings that are also expected to depend at least in part upon the context in which such terms are used. Typically, "or" if used to associate a list, such as A, B, or C, is intended to mean A, B, and C, here used in the inclusive sense, as well as A, B, or C, here used in the exclusive sense. In addition, the term "one or more" as used herein may be used to describe any feature, structure, or characteristic in the singular or may be used to describe some combination of features, structures, or characteristics. However, it should be noted that this is merely an illustrative example and claimed subject matter is not limited to this example. Furthermore, the term "at least one of" if used to associate a list, such as A, B, or C, can be interpreted to mean any combination of A, B, and/or C, such as A, AB, AC, BC, AA, ABC, AAB, AABBCCC, etc.

Further, while certain embodiments have been described using a particular combination of hardware and software, it should be recognized that other combinations of hardware and software are also possible. Certain embodiments may be implemented only in hardware, or only in software, or using combinations thereof. In one example, software may be implemented with a computer program product containing computer program code or instructions executable by one or more processors for performing any or all of the steps, operations, or processes described in this disclosure, where the computer program may be stored on a non-transitory computer readable medium. The various processes described herein can be implemented on the same processor or different processors in any combination.

Where devices, systems, components or modules are described as being configured to perform certain operations or functions, such configuration can be accomplished, for example, by designing electronic circuits to perform the operation, by programming programmable electronic circuits (such as microprocessors) to perform the operation such as by executing computer instructions or code, or processors or cores programmed to execute code or instructions stored on a non-transitory memory medium, or any combination thereof. Processes can communicate using a variety of techniques, including, but not limited to, conventional techniques for inter-process communications, and different pairs of processes may use different techniques, or the same pair of processes may use different techniques at different times.

The specification and drawings are, accordingly, to be regarded in an illustrative rather than a restrictive sense. It will, however, be evident that additions, subtractions, deletions, and other modifications and changes may be made thereunto without departing from the broader spirit and scope as set forth in the claims. Thus, although specific embodiments have been described, these are not intended to be limiting. Various modifications and equivalents are within the scope of the following claims.

What is claimed is:

1. A method of forming an overcoat layer on a surface-relief structure on a substrate, the method comprising:
    receiving the substrate with the surface-relief structure, wherein the surface-relief structure comprises:
        a plurality of ridges slanted with respect to the substrate; and
        a plurality of grooves each between two adjacent ridges; and
    in each cycle of a plurality of cycles,
        depositing a uniform layer of an overcoat material on surfaces of the plurality of ridges and bottoms of the plurality of grooves,
        etching the uniform layer of the overcoat material deposited on top surfaces of the plurality of ridges at a first removal rate to remove at least a portion of the uniform layer of the overcoat material deposited on the top surfaces of the plurality of ridges; and
        etching the uniform layer of the overcoat material deposited on the bottoms of the plurality of grooves at a second removal rate that is lower than the first removal rate to keep at least a portion of the uniform layer of the overcoat material deposited on the bottoms of the plurality of grooves,
    wherein layers of the overcoat material deposited in the plurality of cycles fill the plurality of grooves and, together with the plurality of ridges, form a slanted grating on the substrate, the slanted grating configured to couple light into or out of the substrate.

2. The method of claim 1, wherein the uniform layer of the overcoat material deposited in each cycle comprises one atomic layer of the overcoat material.

3. The method of claim 1, wherein a top surface of the overcoat layer is planar.

4. The method of claim 1, wherein a top surface of the overcoat layer comprises a plurality of planar surface portions and a plurality of concave surface portions forming a plurality of dips having a depth lower than a depth of the plurality of grooves.

5. The method of claim 4, wherein the plurality of dips is aligned with the plurality of grooves.

6. The method of claim 4, wherein a ratio of a depth of the overcoat layer from top surfaces of the plurality of ridges to the top surface of the overcoat layer to the depth of the plurality of dips ranges between 40:1 and 2:1.

7. The method of claim 1, wherein a ratio of a depth of the overcoat layer from top surfaces of the plurality of ridges to a top surface of the overcoat layer to a depth of the plurality of grooves ranges between 1:2 and 1:100.

8. The method of claim 1, wherein the surface-relief structure is characterized by a period varying across the substrate or a duty cycle varying across the substrate.

9. The method of claim 1, wherein the plurality of ridges each have a slant angle that is at least 45°.

10. The method of claim 1, wherein the plurality of grooves each have a depth that is at least 100 nm.

11. The method of claim 1, wherein the uniform layer of the overcoat material deposited in each cycle comprises two or more atomic layers of the overcoat material.

12. The method of claim 1, wherein the at least a portion of the uniform layer of the overcoat material removed from the top surfaces of the plurality of ridges comprise all of the overcoat material deposited on the top surfaces of the plurality of ridges.

13. The method of claim 1, wherein a refractive index of the overcoat material is different from a refractive index of the plurality of ridges.

14. The method of claim 1, wherein the overcoat material comprises at least one of hafnium oxide, titanium oxide, tantalum oxide, tungsten oxide, zirconium oxide, gallium sulfide, gallium nitride, gallium phosphide, silicon, silicon nitride, silicon oxide, alumina, porous silica, a polymer with a refractive index higher than the substrate, or a fluorinated monomer or polymer having a refractive index lower than the substrate.

15. The method of claim 1, wherein the plurality of ridges comprise at least one of amorphous silicon, silicon oxide, silicon nitride, silicon carbide, silicon oxynitride (SiOxNy), spin on carbon (SOC), amorphous carbon, diamond like carbon (DLC), titanium oxide, aluminum oxide, tantalum oxide, or hafnium oxide.

16. The method of claim 1, wherein the substrate comprises a waveguide.

* * * * *